United States Patent
Shinagawa et al.

(10) Patent No.: US 8,222,658 B2
(45) Date of Patent: Jul. 17, 2012

(54) SEMICONDUCTOR LIGHT EMITTING ELEMENT AND METHOD OF MANUFACTURING THEREFOR

(75) Inventors: Tatsuyuki Shinagawa, Tokyo (JP); Hirotatsu Ishii, Tokyo (JP); Akihiko Kasukawa, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 218 days.

(21) Appl. No.: 12/399,520

(22) Filed: Mar. 6, 2009

(65) Prior Publication Data

US 2009/0224240 A1 Sep. 10, 2009

Related U.S. Application Data

(63) Continuation of application No. PCT/JP2007/067505, filed on Sep. 7, 2007.

(30) Foreign Application Priority Data

Sep. 8, 2006 (JP) .................................. 2006-243576
Jul. 27, 2007 (JP) .................................. 2007-196606

(51) Int. Cl.
  *H01L 33/00* (2010.01)
  *H01S 3/13* (2006.01)
(52) U.S. Cl. ...................................... 257/96; 372/43.01
(58) Field of Classification Search .................... 257/96; 372/43.01
  See application file for complete search history.

(56) References Cited

U.S. PATENT DOCUMENTS

| | | | |
|---|---|---|---|
| 5,625,202 A * | 4/1997 | Chai | 257/94 |
| 5,793,061 A * | 8/1998 | Ohuchi et al. | 257/96 |
| 6,839,369 B2 | 1/2005 | Iwai et al. | |
| 6,914,925 B2 | 7/2005 | Shinagawa et al. | |
| 7,616,672 B2 * | 11/2009 | Shakuda | 372/43.01 |
| 2006/0121637 A1 | 6/2006 | Hooper et al. | |

FOREIGN PATENT DOCUMENTS

| | | |
|---|---|---|
| JP | 4-213878 | 8/1992 |
| JP | 6-61527 | 3/1994 |
| JP | 9-116225 | 5/1997 |
| JP | 10-51073 | 2/1998 |
| JP | 2000-77712 | 3/2000 |
| JP | 2004-235492 | 8/2004 |
| JP | 2004-288966 | 10/2004 |
| JP | 2005-203721 | 7/2005 |
| JP | 2005-303250 | 10/2005 |
| JP | 2006-515713 | 6/2006 |

* cited by examiner

*Primary Examiner* — Howard Weiss
*Assistant Examiner* — Steven Rao
(74) *Attorney, Agent, or Firm* — Oblon, Spivak, McClelland, Maier & Neustadt, L.L.P.

(57) ABSTRACT

A semiconductor light emitting element of the present invention comprises: a zinc oxide (ZnO) single crystal substrate 12 with a substrate surface of a plane orientation insusceptible to a piezo electric field; a Lattice-matched layer 13 formed on the substrate surface to be lattice-matched with the ZnO single crystal substrate 12; an active layer 15 of indium gallium nitride ($In_xGa_{1-x}N$, $0<x<1$); two of cladding layers 14 and 16 to be lattice-matched with the active layer 15 and/or the Lattice-matched layer 13.

17 Claims, 16 Drawing Sheets

FIG. 3

| MATERIAL | LATTICE CONSTANT (Å) | | COEFFICIENT OF THERMAL EXPANSION | | THERMAL CONDUCTIVITY | MELTING POINT |
|---|---|---|---|---|---|---|
| | a (Å) | c (Å) | a (×10⁻⁶/K) | c (×10⁻⁶/K) | (W/mk) | (°C) |
| ZnO | 3.2407 | 5.1955 | 2.9-6.5 | 3 | 60 | 1975 |
| GaN | 3.189 | 5.186 | 2.8-5.59 | 3.1-3.7 | 130 | 2500 |
| InN | 3.548 | 5.76 | 4.2 | 3.15 | 45-176 | 1100 |
| AlN | 3.112 | 4.982 | 4.15 | 5.27 | 285 | 2750-3000 |

FIG. 6

| MATERIAL | CRYSTAL STRUCTURE | LATTICE CONSTANT | | MELTING POINT | THERMAL CONDUCTIVITY | COEFFICIENT OF THERMAL EXPANSION (1/K) | | Eg | REFRACTIVE INDEX |
|---|---|---|---|---|---|---|---|---|---|
| | | c (Å) | a (Å) | (°C) | (W/mK) | a0 | c0 | (eV) | |
| ZnO | WZ | 3.2407 | 5.1955 | 1975 | 60 | 6.5 | 3 | 3.4 | 2.1 |
| MgO | WZ (RS) | 3.17 | 5.17 | 2800 | 40 | 13.5 | | 7.8 | 1.74 |
| BeO | WZ | 2.698 | 4.379 | 2530 | 261 | 7.5 | | 10.6 | 0.9785 |
| CdO | WZ (RS) | 3.66 | 5.86 | 1427 | 0.7 | | | 0.84 | 2.49 |

FIG. 9
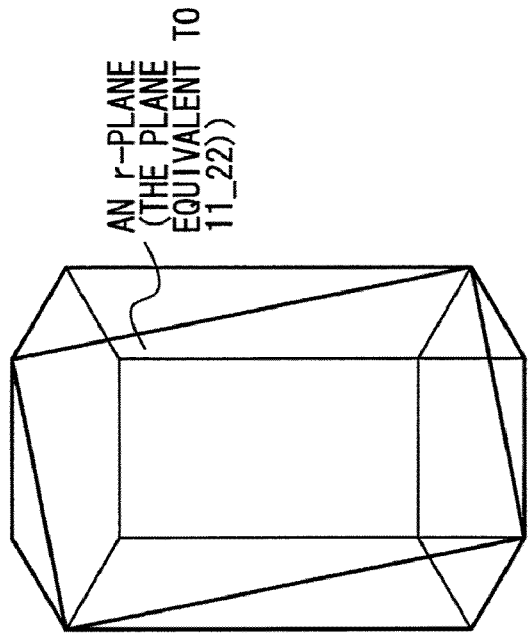
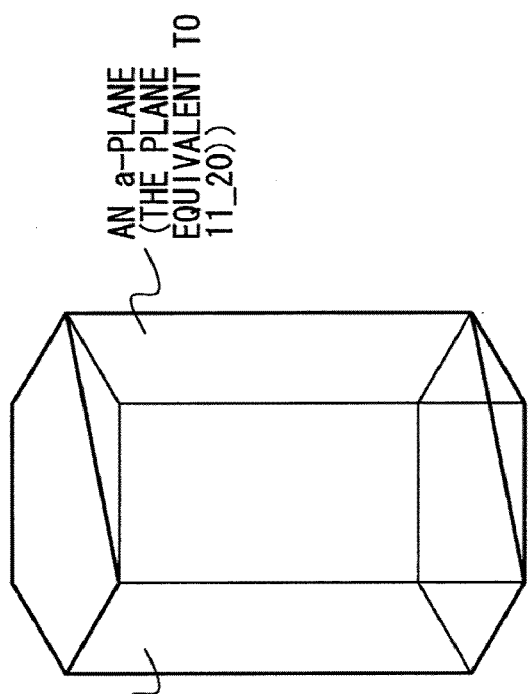

Change in a relative surface roughness in root mean square (RMS) of a ZnO substrate

SEMICONDUCTOR LIGHT EMITTING ELEMENT AND METHOD OF MANUFACTURING THEREFOR

BACKGROUND OF THE INVENTION

1. Technical Field

The present invention relates to a semiconductor light emitting element and a method of manufacturing therefor. More specifically, it relates to a semiconductor light emitting element and a method of manufacturing therefor, to be able to emit a light in a visible light range as longer wavelength than a blue light.

2. Background Art

So far, a semiconductor light emitting element used an indium gallium nitride (InGaN) is known as the semiconductor light emitting element of a blue emission with an emission wavelength of not longer than 480 nm (refer to a patent document 1 for example).

Meanwhile, a band gap energy of an active layer may designed to be narrower for obtaining a green emission of longer wavelength using such the semiconductor light emitting element of InGaN.

As one method therefor, it may be considered that the Indium (In) composition is to be higher therein.

[Patent Document 1] a published Japanese patent application No. 2000-077712

[Nonpatent Document 1] MRS Internet Journal, vol. 1, Article 16, 1996

DISCLOSURE OF THE INVENTION

Problems to be Solved by the Invention

However, in the case of being the Indium (In) composition to be higher, it becomes difficult to obtain the active layer comprising the In with a uniform in composition, and a luminescent efficiency becomes decreased, because a phase separation is occurred therein. Moreover, in the case of being occurred a piezo electric field due to the strain in a crystal structure thereof, a radiative recombination probability becomes decreased, hence, there is occurred a problem that the luminescent efficiency cannot help but be further decreased therein. Furthermore, there are a huge amount of threading dislocations existed in the active layer due to the lattice constant being quite different from that of the substrate, hence, there is occurred further problem that not only the decrease of the luminescent efficiency but also a favorable reliability is not able to be obtained.

For suppressing such the above mentioned matters, it is able to use a substrate or a cladding layer, lattice-matched with (having lattice constants close to that of) the active layer of a nitride based semiconductor, such as the InGaN or the like. And, a zinc oxide (ZnO) single crystal substrate is appropriate for such the substrate. However, there is occurred further problem that the ZnO cannot help but be sublimated at a temperature of 750° C. or higher at the period of growing the nitride based semiconductor, such as the InGaN or the like, on the ZnO single crystal substrate in an atmosphere using an ammonia ($NH_3$).

Moreover, a steepness of an interface is not able to be obtained due to a reaction at the interface between the ZnO single crystal substrate and the GaN layer in the case of growing a gallium nitride (GaN) layer directly on the ZnO single crystal substrate, hence, there is occurred further problem that a favorably crystallized GaN layer is not able to be obtained (refer to a nonpatent document 1 for example, as there is reported a $Ga_2ZnO_4$ is to be formed therein).

Furthermore, in the case of being grown the InGaN layer directly on the ZnO single crystal substrate, there are observed a formation of the convoluted interfacial layer due to the above mentioned interfacial reaction, or a local diffusion of the gallium (Ga) into the ZnO substrate as shown in FIGS. 16 (A) and (B), hence, there is occurred further problem that a favorably crystallized InGaN layer is not able to be obtained.

Here, an object of the present invention is to provide an InGaN based laser diode as a semiconductor light emitting element that comprises every element with a uniform in composition distribution and with a high Indium (In) composition, with decreasing adverse effects from the piezo electric field and the threading dislocations, for obtaining a high luminescent efficiency, and to provide a method of manufacturing such the semiconductor light emitting element.

Means for Solving the Problem

A semiconductor light emitting element according to a first aspect of the present invention for solving the above mentioned problems comprises: a zinc oxide (ZnO) single crystal substrate with a substrate surface of a plane orientation insusceptible to a piezo electric field; a Lattice-matched layer formed on the substrate surface to be lattice-matched with the ZnO single crystal substrate; an active layer of indium gallium nitride ($In_xGa_{1-x}N$, $0<x<1$); a upper cladding layer and a lower cladding layer to be lattice-matched with at least of the active layer and the Lattice-matched layer; and a contact layer to be formed on the upper cladding layer.

According to the aspect, it is able to obtain a layer comprising every element with a uniform in composition distribution without being occurred the phase separation even in the case of the InGaN based laser diode with a high Indium (In) composition, because there are provided the Lattice-matched layer to be lattice-matched with the ZnO single crystal substrate, the active layer and two of the upper and the lower cladding layers to be lattice-matched with at least of the active layer and the Lattice-matched layer, on the ZnO single crystal substrate with a substrate surface of a plane orientation insusceptible to a piezo electric field. Moreover, with suppressing the piezo electric field and decreasing the threading dislocations, it is able to make higher the radiative recombination probability, hence, it is able to increase the luminescent efficiency as sufficiently high.

In a semiconductor light emitting element according to a second aspect of the present invention, the plane orientation is to be any one of an m-plane (($1\bar{1}00$) plane) an a-plane (($11\bar{2}0$) plane), a c-plane (($0001$) plane), an r-plane (($11\bar{2}2$) plane) and a ($10\bar{1}\bar{1}$) plane, or a plane orientation equivalent thereto.

According to the aspect, it is able to decrease the adverse effects from the piezo electric field, because the plane orientation of the ZnO single crystal substrate corresponds to a nonpolar face. Meanwhile, it is able to reduce a distortion of the active layer and to suppress the piezo electric field even in the cases of the c-plane as polar faces, because the lattice constant for the substrate as the ZnO single crystal is close to that of the InGaN layer rather than that of the GaN layer.

In a semiconductor light emitting element according to a third aspect of the present invention, the Lattice-matched layer is to be formed of an aluminum gallium indium nitride ($Al_{1-y-x}Ga_yIn_zN$, $0 \leq y<1$, $0 \leq z<1$, $y+z \leq 1$) and/or a zinc magnesium beryllium cadmium oxide ($Zn_{1-a-b-c}Mg_aBe_bCd_cO$, $0 \leq a<1$, $0 \leq b<1$, $0 \leq c<1$, $a+b+c \leq 1$).

According to the aspect, it is able to equalize the lattice constant with that of the ZnO single crystal substrate, and to obtain a layer comprising a uniform composition of the In without being occurred the phase separation even in the case of the InGaN based semiconductor light emitting element (laser diode) with a high Indium (In) composition.

In a semiconductor light emitting element according to a fourth aspect of the present invention, the upper cladding layer and the lower cladding layer are to be formed of an aluminum gallium indium nitride ($Al_{1-y-z}Ga_yIn_zN$, $0 \leq y < 1$, $0 \leq z < 1$, $y+z \leq 1$) and/or a zinc magnesium beryllium cadmium oxide ($Zn_{1-a-b-c}Mg_aBe_bCd_cO$, $0 \leq a < 1$, $0 \leq b < 1$, $0 \leq c < 1$, $a+b+c \leq 1$).

According to the aspect, it is able to obtain a layer comprising a uniform composition of the In without being occurred the phase separation even in the case of the InGaN based semiconductor light emitting element (laser diode) with a high Indium (In) composition.

In a semiconductor light emitting element according to a fifth aspect of the present invention, the lower cladding layer has a function combined with the Lattice-matched layer.

According to the aspect, it becomes to be simplified regarding a device structure of the semiconductor light emitting element.

A semiconductor light emitting element according to a sixth aspect of the present invention further comprises: a Pseudo-morphic layer to be formed between the ZnO single crystal substrate and the active layer.

According to the aspect, it is able to obtain a steep nitride/oxide interface between the ZnO single crystal substrate and the active layer, and to obtain the favorably crystallized active layer of InGaN, because the Pseudo-morphic layer is formed between the ZnO single crystal substrate and the active layer. As a result, it is able to obtain a semiconductor light emitting element with a high luminescent efficiency and a high reliability.

Moreover, it is able to realize a semiconductor light emitting element for obtaining a green emission of longer wavelength, because it is able to suppress the piezo electric field, to suppress the phase separation between the GaN and the InN despite the large difference of a bond length, and to decrease the threading dislocations, even in the case of using the active layer of InGaN with the high Indium (In) composition necessary for realizing a light emitting element in a visible light of longer wavelength than a blue light (a green light for example), with using the ZnO single crystal substrate.

As a cause that it is not able to obtain the InGaN layer comprising a high crystal quality, it is to be considered that a steepness at the interface is not able to be obtained because the Ga is diffused into the ZnO single crystal substrate. As for the reasons for being the Ga diffused into the ZnO single crystal substrate, it is to be considered that a surface flatness of the ZnO single crystal substrate is poor, impurities in a chemical mechanical polishing process is not removed completely thereafter, the ZnO is sublimated in a high temperature environment at the initial period of growing, or the like.

Here, it is able to be considered the following four methods for flattening the substrate surface:

(a) performing a heat treatment at a high temperature of between 1000 and 1300° C. for one to five hours in a chamber made from a ceramic ZnO;

(b) using an oxygen polar (O-polar) face of a substrate to be able to obtain more flat surface in the heat treatment (a);

(c) performing a heat treatment (at 1000° C. for 30 minutes approximately) in a vacuum chamber before growing a layer on the substrate surface, such as in a vacuum, in an oxygen atmosphere, or with exposing to an oxygen plasma, or the like; and (d) epitaxial growing a ZnO buffer layer onto the ZnO substrate.

Moreover, a nitride based semiconductor is to be grown on the ZnO substrate using a method, such as a molecular beam epitaxy (MBE), a pulsed laser deposition (PLD), a metal organic chemical vapor deposition (MOCVD), or the like, not with the ammonia but with a nitrogen plasma for being possible to grow at a low temperature as not more than 750° C., because the $Ga_2ZnO_4$ cannot help but be formed in the case of being grown in the higher temperature environment.

As for the reason for forming the Pseudo-morphic layer onto the ZnO substrate is due to an adsorption coefficient of the In being different from that of the Ga for the ZnO substrate, as the adsorption coefficient of the In is relatively smaller than that of the Ga. As a result, during the InGaN layer being grown on the ZnO substrate, the In is easy to be segregated at a top surface of the layer, an In drop is easy to be formed at the top surface thereof, and a surface excess layer of the In cannot help but be formed. Or, a three-dimensional island cannot help but be appeared from the beginning of growing, as it is called the Volmer-Weber (VW) growth mode is appeared, because a state of the substrate being exposed becomes a lower energy level, due to a sum of energy levels of an interface between the ZnO single crystal substrate and the InGaN growth layer and that of the InGaN growth layer being larger than a surface energy of the ZnO single crystal substrate. Therefore, it is considered to grow first a GaN layer as a binary material without including the In on the ZnO substrate, or to grow first a InN layer as a binary material without including the Ga. In either one of such the cases, each thickness of the GaN layer or the InN layer is to be not less than one monolayer (ML), but not more than a critical thickness for the ZnO single crystal substrate respectively, for maintaining the lattice constant at the top surface region of the layer as similar to that of the ZnO substrate.

In a semiconductor light emitting element according to a seventh aspect of the present invention, the Pseudo-morphic layer is to be formed of gallium nitride (GaN) with a thickness of not less than one monolayer (ML), but not more than a critical thickness for the ZnO single crystal substrate.

According to the aspect, it is able to obtain an active layer comprising a high crystal quality, as it is able to grow the active layer of InGaN, lattice-matched with the ZnO single crystal substrate, onto a top surface of the Pseudo-morphic layer with maintaining the lattice constant of the ZnO single crystal as the substrate, because the Pseudo-morphic layer is to be formed of GaN as a thin layer with a thickness of not less than 1 ML, but not more than a critical thickness for the ZnO single crystal substrate.

In a semiconductor light emitting element according to an eighth aspect of the present invention, the Pseudo-morphic layer is to be formed of GaN and indium nitride (InN) as a superlattice layer with a thickness of not less than 1 ML, but not more than a critical thickness for the ZnO single crystal substrate.

According to the aspect, it is able to obtain an active layer comprising a favorable crystalline, as it is able to grow the active layer of InGaN lattice-matched with the ZnO single crystal substrate onto a top surface of the Pseudo-morphic layer with maintaining the lattice constant of the ZnO single crystal as the substrate.

Moreover, it is able to form the Pseudo-morphic layer thicker, comparing to the case the Pseudo-morphic layer is formed of GaN except of InN with a thickness of not less than 1 ML, but not more than a critical thickness for the substrate. As a result, it is able to obtain an active layer comprising a further favorable crystalline, because it becomes hard for impurities to migrate from the substrate into the active layer of InGaN.

In a semiconductor light emitting element according to a ninth aspect of the present invention, a Indium (In) composition in the active layer is ≧20% and ≦100%.

According to the aspect, it is able to certainly perform a light emission in a visible light range as a long wavelength, such as the green emission or the like, because a band gap energy is able to correspond to the visible light range as the longer wavelength than that of the blue light, such as the green light range or the like.

A method of manufacturing a semiconductor light emitting element according to a tenth aspect of the present invention comprises the steps of: processing of substrate surface treatments for reforming a substrate surface of a zinc oxide (ZnO) single crystal as a substrate with a plane orientation insusceptible to a piezo electric field; processing of a Lattice-matched layer formation to form a Lattice-matched layer on the substrate surface, as lattice-matched with the ZnO single crystal substrate; processing of a lower cladding layer formation to form a lower cladding layer on the Lattice-matched layer, as lattice-matched with an active layer and/or the Lattice-matched layer; processing of an active layer formation to form the active layer of indium gallium nitride ($In_xGa_{1-x}N$, $0<x<1$) on the lower cladding layer; and processing of a upper cladding layer formation to form a upper cladding layer on the active layer, as lattice-matched with the active layer and/or the Lattice-matched layer.

In a method of manufacturing a semiconductor light emitting element according to an eleventh aspect of the present invention, the plane orientation is to be any one of an m-plane ($1\bar{1}00$), an a-plane ($11\bar{2}0$), a c-plane ($0001$), an r-plane ($11\bar{2}2$) and a ($10\bar{1}1$) plane, or a plane orientation equivalent thereto.

A method of manufacturing a semiconductor light emitting element according to a twelfth aspect of the present invention further comprises the steps of: processing of a Pseudo-morphic layer formation to form a Pseudo-morphic layer between the ZnO single crystal substrate and the active layer.

In a method of manufacturing a semiconductor light emitting element according to a thirteenth aspect of the present invention, the processing of the Pseudo-morphic layer formation processes a heat treatment before forming the Pseudo-morphic layer, such as in a vacuum, in an oxygen atmosphere, or with exposing to an oxygen plasma, or the like.

In a method of manufacturing a semiconductor light emitting element according to a fourteenth aspect of the present invention, the processing of the Pseudo-morphic layer formation further processes for the Pseudo-morphic layer to glow in a temperature environment of lower than 750° C., with using such as a nitrogen plasma or the like.

EFFECTS OF THE INVENTION

According to the present invention, it is able to obtain an InGaN based laser diode as a semiconductor light emitting element that comprises every element with a uniform in composition distribution and with a high Indium (In) composition, with decreasing adverse effects from the piezo electric field and decreasing the threading dislocations, but with a high luminescent efficiency.

BRIEF DESCRIPTION OF THE DRAWINGS

FIG. 3 is a table showing a physical property of a zinc oxide, a gallium nitride, an indium nitride and an aluminum nitride.

FIG. 6 is a table showing a physical property of a zinc oxide, a magnesium oxide, a beryllium oxide and a cadmium oxide.

FIG. 9 is a drawing showing a crystal structure for a wurtzite-type crystal structure.

| Brief Description of the Reference Symbols | |
|---|---|
| 10: | SEMICONDUCTOR LASER DIODE, AS SEMICONDUCTOR LIGHT EMITTING ELEMENT |
| 11: | LOWER ELECTRODE LAYER |
| 12: | ZnO SINGLE CRYSTAL SUBSTRATE |
| 13: | LATTICE-MATCHED LAYER |
| 14: | LATTICE-MATCHED BASED LOWER CLADDING LAYER |
| 15: | InGaN BASED ACTIVE LAYER |
| 16: | LATTICE-MATCHED BASED UPPER CLADDING LAYER |
| 17: | CONTACT LAYER |
| 18: | PASSIVATION FILM LAYER |
| 19: | UPPER ELECTRODE LAYER |
| 21, 22: | OPTICAL GUIDING LAYER |
| 23: | LATTICE-MATCHED LAYER |
| 100, 100A: | SEMICONDUCTOR LASER DIODE, AS SEMICONDUCTOR LIGHT EMITTING ELEMENT |
| 130: | PSEUDO-MORPHIC LAYER |
| 130A: | PSEUDO-MORPHIC LAYER |

BEST MODE FOR CARRYING OUT THE INVENTION

Preferred embodiments of the present invention will be described in detail below, with reference to the drawings.

The First Embodiment

Figure 1:
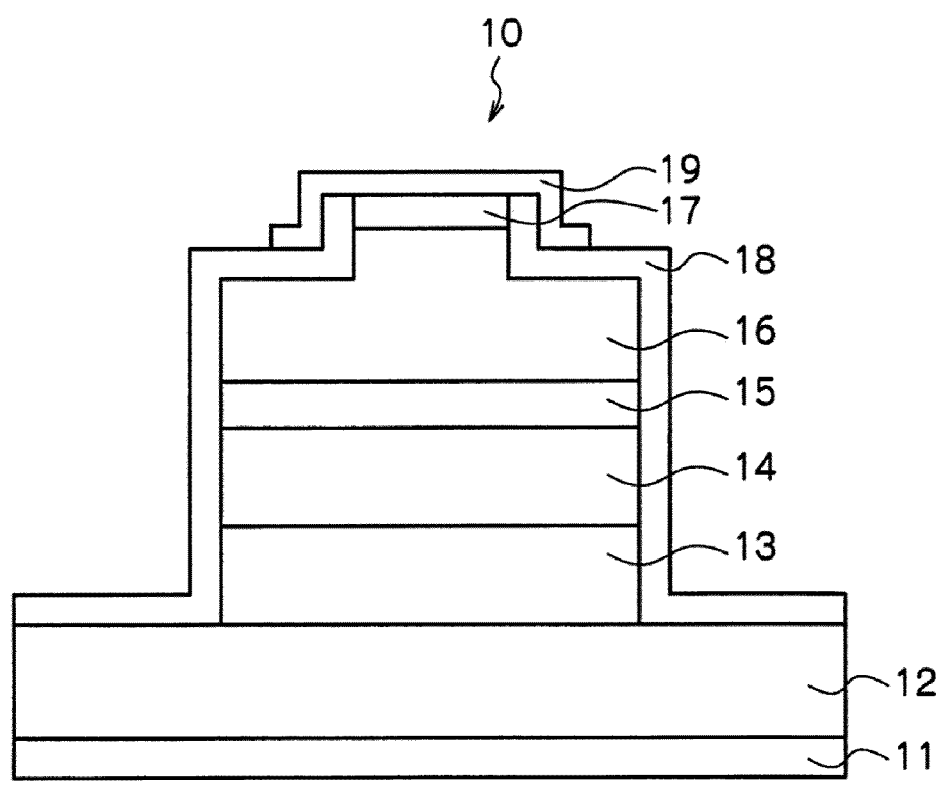
FIG. 1 is a cross sectional view showing a brief configuration of a semiconductor light emitting element regarding the first embodiment of the present invention.

FIG. 1 is a cross sectional view showing a brief configuration of a semiconductor light emitting element regarding the first embodiment of the present invention.

A semiconductor light emitting element 10 comprises a lower electrode layer 11, a zinc oxide (ZnO) single crystal substrate 12, a Lattice-matched layer 13, a lattice-matched based lower cladding layer 14, an indium gallium nitride (InGaN) based active layer 15, a lattice-matched based upper cladding layer 16, a contact layer 17, a passivation film layer 18 and a upper electrode layer 19.

The lower electrode layer 11 is designed to be formed on a rear surface side of the ZnO single crystal substrate 12 for the semiconductor light emitting element 10 of the present embodiment, because the ZnO single crystal substrate of the present embodiment is electrically conductive. As a result, it is possible to comprise a vertical semiconductor device structure because it is able to form electrodes on both surface sides of the ZnO single crystal substrate 12, according to the semiconductor light emitting element 10 of the present embodiment.

Here, an electrically conductive type of the ZnO single crystal substrate 12 is either one of an n-type or a p-type, and the Lattice-matched layer 13 and the lower cladding layer 14 have the electrically conductive type similar to that of the ZnO single crystal substrate 12, meanwhile, the upper cladding layer 16 and the contact layer 17 have the opposite electro-conductivity therefrom. Moreover, the Lattice-matched layer 13 may be unnecessary in case the lower cladding layer 14 is lattice-matched with the ZnO single crystal substrate 12 as having a function combined with the Lattice-matched layer.

Figure 2A:
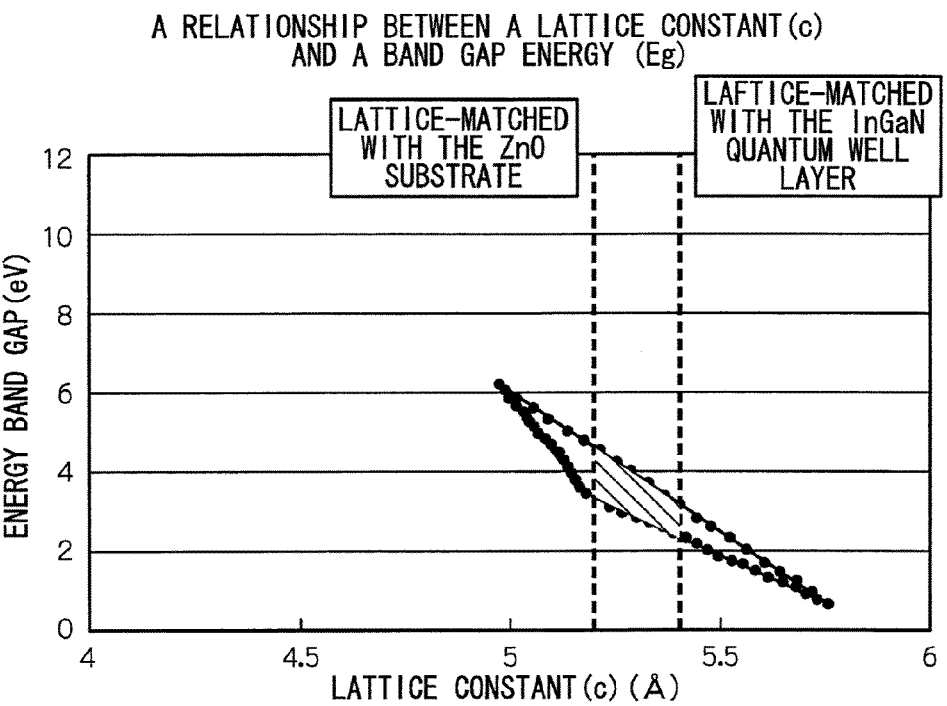
FIG. 2A is a graph showing a relationship between a band gap energy (Eg) and a lattice constant (c) for each corresponding mixed crystal ratio in a semiconductor comprised of an aluminum nitride (AlN), a gallium nitride (GaN) and an indium nitride (InN).

FIG. 2A is a graph showing a relationship between a band gap energy (Eg) and a lattice constant (c) for each corresponding mixed crystal ratio in a semiconductor comprised of an aluminum nitride (AlN), a gallium nitride (GaN) and an indium nitride (InN). Meanwhile, FIG. 2B is a graph showing a relationship between a band gap energy (Eg) and a lattice constant (a) for each corresponding mixed crystal ratio in a semiconductor comprised of an aluminum nitride (AlN), a gallium nitride (GaN) and an indium nitride (InN)

FIG. 3 is a table showing a physical property of a zinc oxide, a gallium nitride, an indium nitride and an aluminum nitride.

Figure 2B:
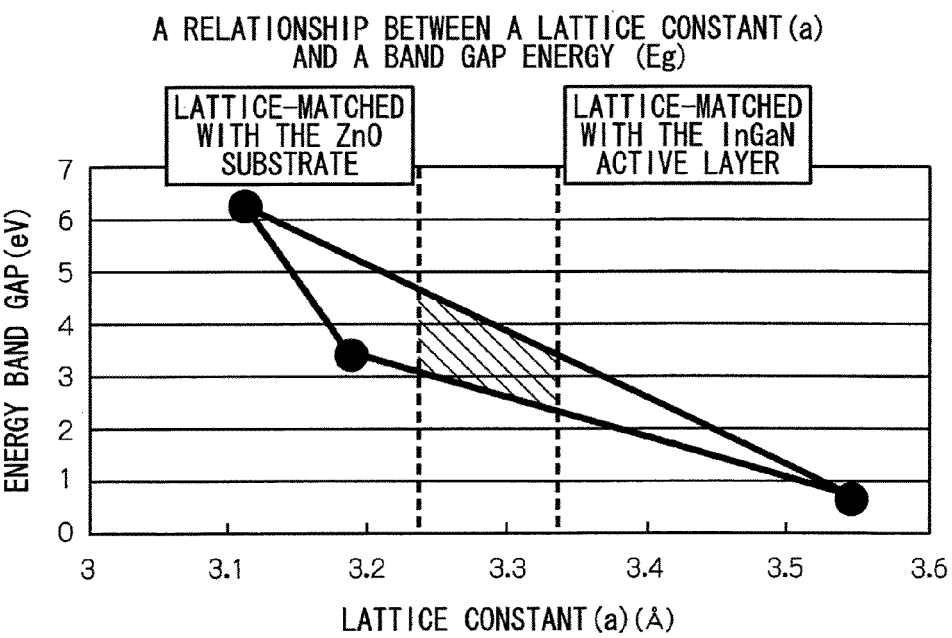
FIG. 2B is a graph showing a relationship between a band gap energy (Eg) and a lattice constant (a) for each corresponding mixed crystal ratio in a semiconductor comprised of an aluminum nitride (AlN), a gallium nitride (GaN) and an indium nitride (InN).

As shown in FIG. 2B and FIG. 3, a lattice constant (=5.1955 angstroms (Å)) of the ZnO single crystal substrate 12 corresponding to a unit cell (c) is between the lattice constant (=5.186 angstroms) of a gallium nitride (GaN) corresponding to the unit cell (c) and the lattice constant (=5.76 angstroms) of a indium nitride (InN) corresponding to the unit cell (c), which means fairly close to the unit cell (c) for an indium gallium nitride (InGaN) with a indium (In) composition being approximately 20% therein.

Figure 4A:
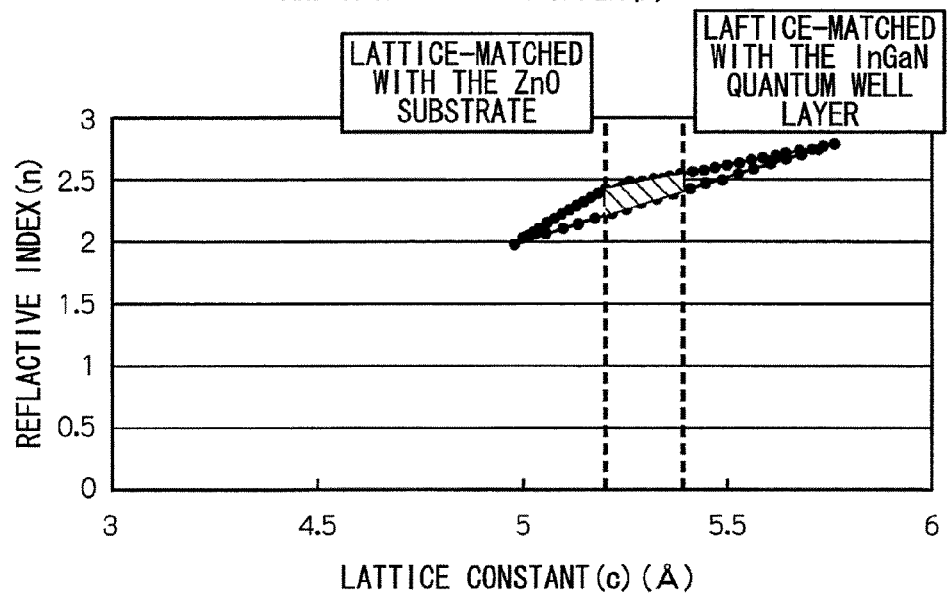
FIG. 4A is a graph showing a relationship between a refractive index (n) and a lattice constant (c) for each corresponding mixed crystal ratio in a semiconductor comprised of an aluminum nitride (AlN), a gallium nitride (GaN) and an indium nitride (GaN).
Figure 4B:
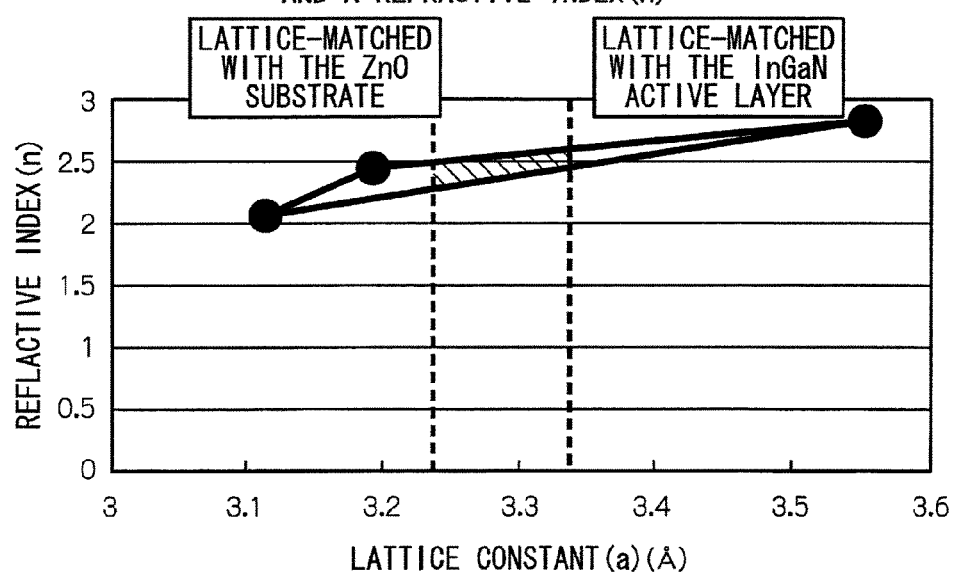
FIG. 4B is a graph showing a relationship between a refractive index (n) and a lattice constant (a) for each corresponding mixed crystal ratio in a semiconductor comprised of an aluminum nitride (AlN), a gallium nitride (GaN) and an indium nitride (InN).

FIG. 4A is a graph showing a relationship between a refractive index (n) and a lattice constant (c) for each corresponding mixed crystal ratio in a semiconductor comprised of an aluminum nitride (AlN), a gallium nitride (GaN) and an indium nitride (InN). Meanwhile, FIG. 4B is a graph showing a relationship between a refractive index (n) and a lattice constant (a) for each corresponding mixed crystal ratio in a semiconductor comprised of an aluminum nitride (AlN), a gallium nitride (GaN) and an indium nitride (InN).

The Lattice-matched layer 13 is provided for performing a lattice match with the ZnO single crystal substrate 12. And, the refractive index is to be set as a lower refractive index side in each hatched area shown in FIG. 4A and FIG. 4B, that is to say, to be set for comprising the lattice constant equivalent to or relatively smaller than that of an InGaN based active layer 15 which will be mentioned below. Moreover, the Lattice-matched layer 13 is to be formed of the indium gallium nitride ($In_xGa_{1-x}N$, $0<x<1$), an aluminum gallium indium nitride ($Al_{1-y-z}Ga_yIn_zN$, $0 \leq y<1$, $0 \leq z<1$, $y+z \leq 1$), or an aluminum indium nitride (AlInN).

The Lattice-matched based lower cladding layer 14 has a refractive index smaller than that of the InGaN based active layer 15 functions as a core which will be mentioned below, and it fulfills a role of confining a light stably inside the InGaN based active layer 15, because it is lattice-matched as within each hatched area shown in FIG. 4A and FIG. 4B, that is to say, for comprising the lattice constant equivalent to or relatively smaller than that of the InGaN based active layer 15.

Figure 5A:
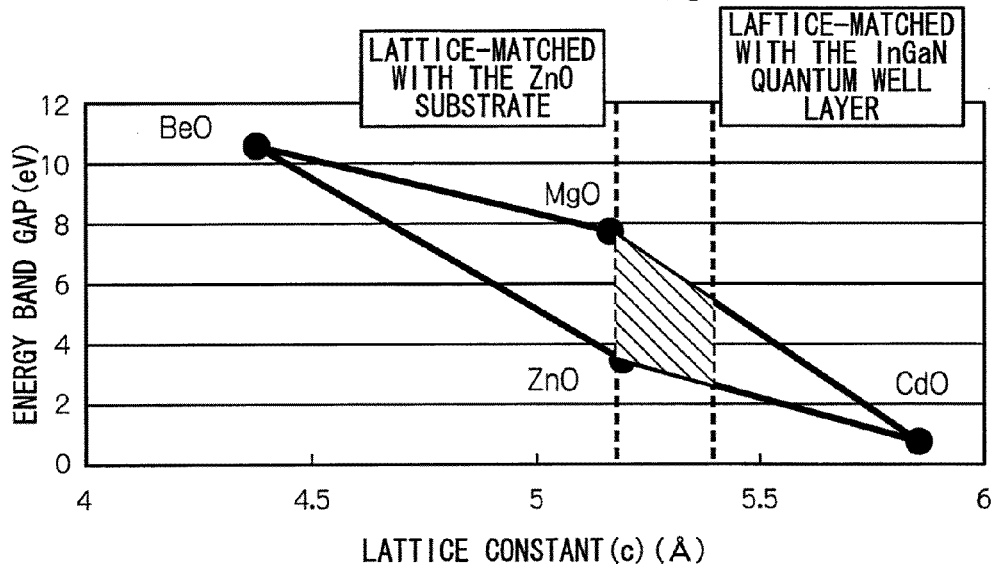
FIG. 5A is a graph showing a relationship between a band gap energy (Eg) and a lattice constant (c) for each corresponding mixed crystal ratio in a semiconductor comprised of a zinc oxide (ZnO), a magnesium oxide (MgO), a beryllium oxide (BeO) and a cadmium oxide (CdO).
Figure 5B:
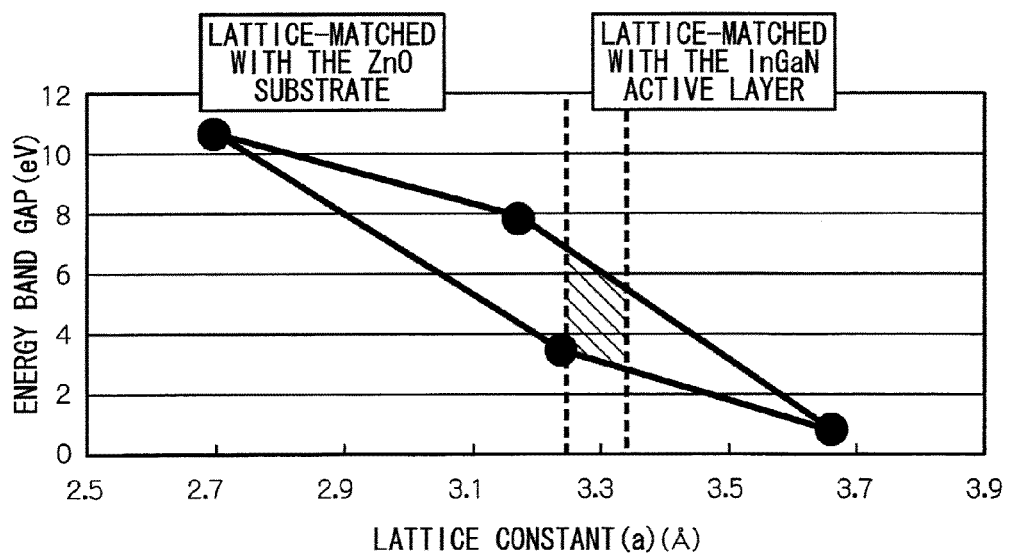
FIG. 5B is a graph showing a relationship between a band gap energy (Eg) and a lattice constant (a) for each corresponding mixed crystal ratio in a semiconductor comprised of a zinc oxide (ZnO), a magnesium oxide (MgO), a beryllium oxide (BeO) and a cadmium oxide (CdO).

FIG. 5A is a graph showing a relationship between a band gap energy (Eg) and a lattice constant (c) for each corresponding mixed crystal ratio in a semiconductor comprised of a zinc oxide (ZnO), a magnesium oxide (MgO), a beryllium oxide (BeO) and a cadmium oxide (CdO). Meanwhile, FIG. 5B is a graph showing a relationship between a band gap energy (Eg) and a lattice constant (a) for each corresponding mixed crystal ratio in a semiconductor comprised of a zinc oxide (ZnO), a magnesium oxide (MgO), a beryllium oxide (BeO) and a cadmium oxide (CdO).

FIG. 6 is a table showing a physical property of a zinc oxide, a magnesium oxide, a beryllium oxide and a cadmium oxide.

As shown in FIG. 5A and FIG. 6, a lattice constant (=5.1955 Å) of the ZnO single crystal substrate 12 corresponding to a unit cell (c) is between the lattice constant (=4.379 Å) of a beryllium oxide (BeO) corresponding to the unit cell (c) and the lattice constant (=5.86 Å) of a cadmium oxide (CdO) corresponding to the unit cell (c).

Figure 7A:
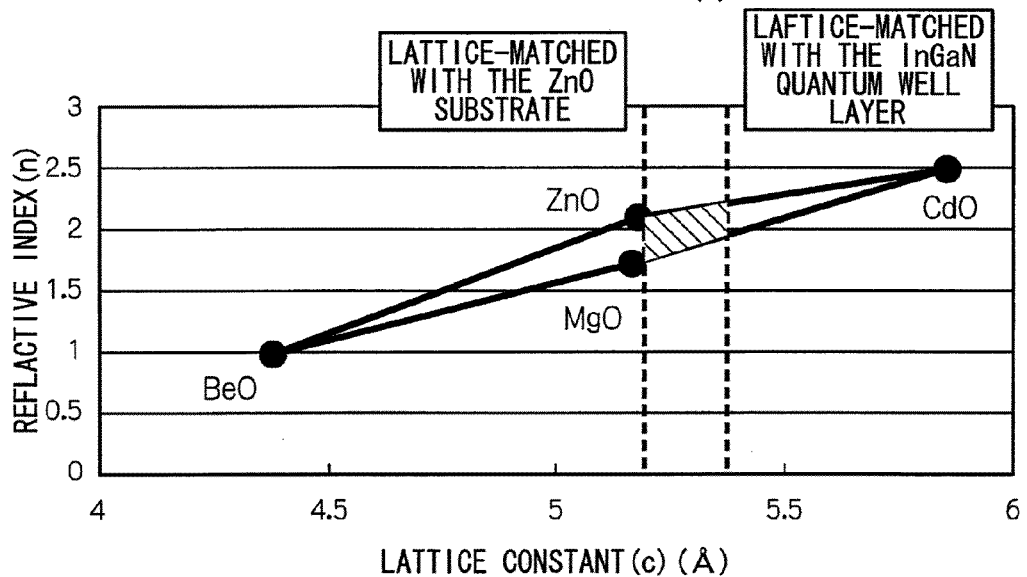
FIG. 7A is a graph showing a relationship between a refractive index (n) and a lattice constant (c) for each corresponding mixed crystal ratio in a semiconductor comprised of a zinc oxide (ZnO), a magnesium oxide (MgO), a beryllium oxide (BeO) and a cadmium oxide (CdO).
Figure 7B:
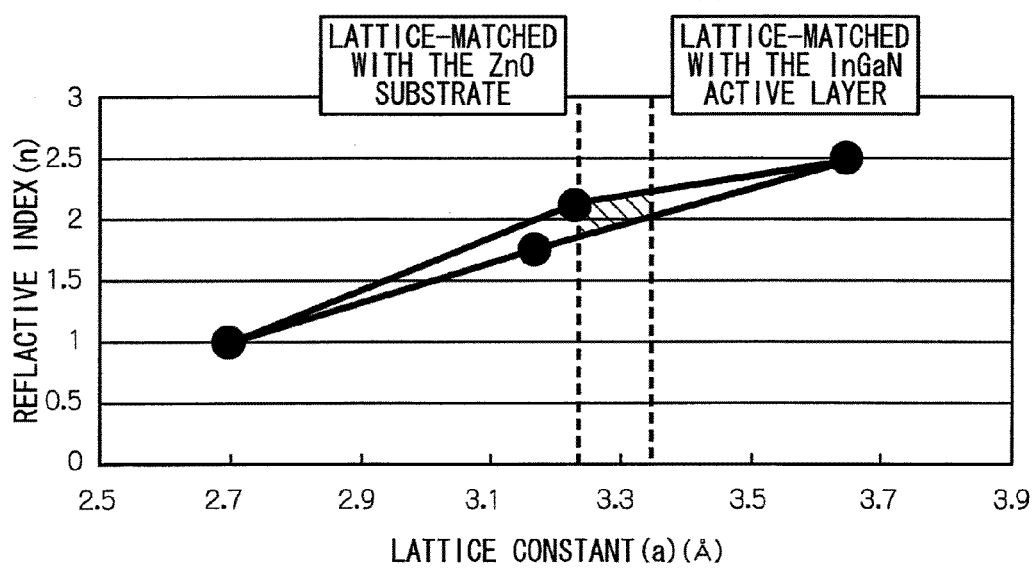
FIG. 7B is a graph showing a relationship between a refractive index (n) and a lattice constant (a) for each corresponding mixed crystal ratio in a semiconductor comprised of a zinc oxide (ZnO), a magnesium oxide (MgO), a beryllium oxide (BeO) and a cadmium oxide (CdO).

FIG. 7A is a graph showing a relationship between a refractive index (n) and a lattice constant (c) for each corresponding mixed crystal ratio in a semiconductor comprised of a zinc oxide (ZnO), a magnesium oxide (MgO), a beryllium oxide (BeO) and a cadmium oxide (CdO). Meanwhile, FIG. 7B is a graph showing a relationship between a refractive index (n) and a lattice constant (a) for each corresponding mixed crystal ratio in a semiconductor comprised of a zinc oxide (ZnO), a magnesium oxide (MgO), a beryllium oxide (BeO) and a cadmium oxide (CdO).

The Lattice-matched layer 13 is provided for performing the lattice match with the ZnO single crystal substrate 12. And, the refractive index is to be set as a lower refractive index side in each hatched area shown in FIG. 7A and FIG. 7B, that is to say, to be set for comprising the lattice constant equivalent to or relatively smaller than that of an InGaN based active layer 15 which will be mentioned below. Moreover, the Lattice-matched layer 13 is to be formed of a zinc magnesium beryllium cadmium oxide ($Zn_{1-a-b-c}Mg_aBe_bCd_cO$, $0 \leq a < 1$, $0 \leq b < 1$, $0 \leq c < 1$, $a+b+c \leq 1$) including a zinc magnesium cadmium oxide (ZnMgCdO), a zinc magnesium beryllium oxide (ZnMgBeO), and a zinc oxide (ZnO), or a zinc magnesium beryllium cadmium oxide (ZnMgBeCdO).

The lattice-matched based lower cladding layer 14 has a refractive index smaller than that of the InGaN based active layer 15 functions as a core which will be mentioned below, and it fulfills the role of confining a light stably inside the InGaN based active layer 15, because it is lattice-matched as within each hatched area shown in FIG. 7A and FIG. 7B, that is to say, for comprising the lattice constant equivalent to or relatively smaller than that of the InGaN based active layer 15.

The InGaN based active layer 15 has a double heterojunction structure, which is sandwiched between the lattice-matched based lower cladding layer 14 and a lattice-matched based upper cladding layer 16 which will be mentioned below. And, electrons are supplied from the lattice-matched based lower cladding layer 14 into the InGaN based active layer 15, meanwhile positive holes are supplied from the lattice-matched based upper cladding layer 16 side into the InGaN based active layer 15, at the time of being applied a voltage in a forward direction by an external electrode. As a result, a stimulated radiation becomes to be occurred, because the InGaN based active layer 15 becomes a population inversion state. Moreover, the emitted light is amplified during repeating the stimulated emission of radiation and emitted as a laser light outside therefrom, because of a reflecting mirror structure for both end faces of the InGaN based active layer 15. Finally, the laser light becomes a continuous wave oscillation mode, because a reflex loop reaches an equilibrium state.

The lattice-matched based upper cladding layer 16 has a refractive index smaller than that of the InGaN based active layer 15 functions as a core, as similar to the above mentioned lattice-matched based lower cladding layer 14, and it fulfills the role of confining a light stably inside the InGaN based active layer 15, because it is grid controlled for being lattice-matched as within each hatched area shown in FIG. 4A and FIG. 4B, that is to say, for comprising the lattice constant equivalent to or relatively smaller than that of the InGaN based active layer 15.

The contact layer 17 is for realizing an ohmic contact with a upper electrode layer 19. A passivation film layer 18 functions as an overcoat. The upper electrode layer 19 functions as a terminal for being supplied from an external power source.

Next, a method of manufacturing a semiconductor light emitting element of the first embodiment of the present invention will be described in detail below.

Figure 8:
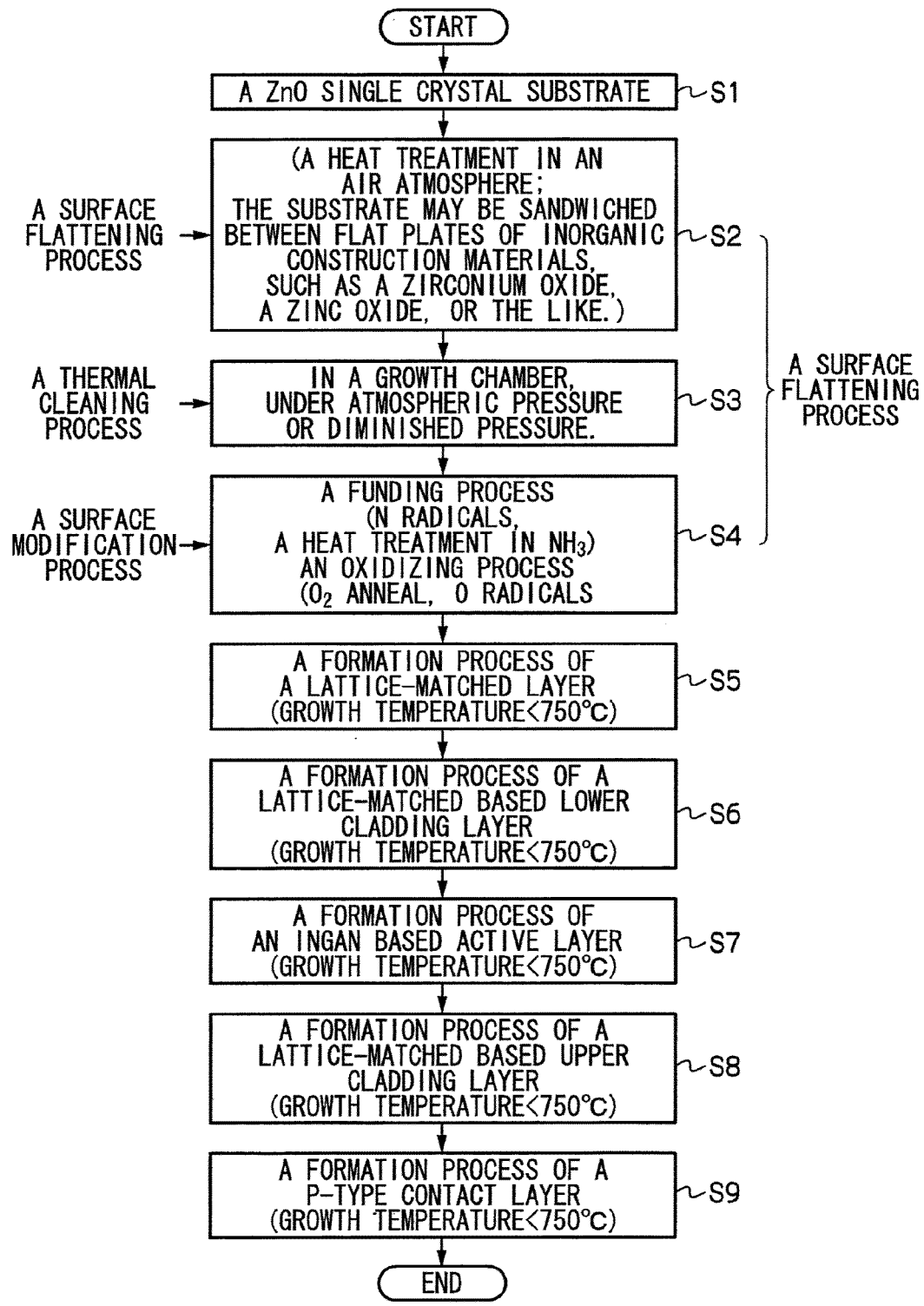
FIG. 8 is a process flow diagram of an epitaxial wafer for semiconductor light emitting elements regarding the first embodiment of the present invention.

FIG. 8 is a process flow diagram of an epitaxial wafer for semiconductor emitting elements regarding the first embodiment.

First, an epitaxial wafer for laser diodes in a visible light range with a long wavelength, such as in a green light range or the like, will be described below.

A ZnO single crystal substrate is prepared, which has a predetermined crystal plane as a substrate face (a top surface) (a step S1).

Here, the predetermined crystal plane will be described below.

As above mentioned, in the case of being the Indium (In) composition to be higher, it becomes difficult to obtain the active layer comprising the In with a uniform in composition, and a luminescent efficiency becomes decreased, because a phase separation is occurred therein.

It is considered as one reason that the lattice constant of the substrate is quite different from that of the Lattice-matched layers, the cladding layers, or the active layer, that is to say, a mismatching of the lattice constants therebetween.

Therefore, it is necessary to select a material having a further preferred lattice constant, from the point of views of the band gap energy and the lattice constant corresponding to the emission wavelength.

Moreover, it may be available for a substrate surface to use a crystal plane with a plane orientation insusceptible to a piezo electric field, for preventing from a problem that the luminescent efficiency cannot help but be further decreased in the active layer due to a radiative recombination probability becomes decreased by being separated spatially between the electrons and the positive holes in the case of being occurred a piezo electric field due to the strain in a crystal structure thereof. That is to say, it may be available for the substrate surface to use the crystal plane with a plane orientation corresponding to a nonpolar face. Meanwhile, even in the case of a c-plane (0001) as polar faces, a distortion of the active layer is reduced and it is able to suppress the piezo electric field, because the lattice constant for the substrate as the ZnO single crystal is close to that of the InGaN layer rather than that of the GaN layer.

FIG. 9 is a drawing of a unit cell showing plane orientations for a wurtzite-type crystal structure.

More specifically, it may be available for the substrate surface to use such as an a-plane (11$\bar{2}$0), m-plane (1$\bar{1}$00), an r-plane (11$\bar{2}$2) to be inclined from the a-plane, a (10$\bar{1}\bar{1}$) plane, or the like, in the case of using the wurtzite-type crystal structure (refer to FIG. 9) for a substrate, such as the ZnO single crystal substrate 12 of the present embodiment.

After the above mentioned step S1, a surface flattening process is performed for the single crystal substrate 12 (a step S2).

In particular, a stepped terrace structure is formed by performing a heat treatment at a high temperature of between 1000 and 1300° C. for one to five hours in an air atmosphere. It is desirable to perform in a condition that the substrate is sandwiched between flat plates of inorganic construction materials, such as a zirconium oxide, a zinc oxide, or the like.

Next, a thermal cleaning process is performed in a growth chamber, under atmospheric pressure or diminished pressure. (a step S3).

Specifically, organic impurities and the like are removed by performing a heat treatment at a temperature of between 800 and 850° C. for 10 to 60 minutes.

Next, a nitridation treatment is performed in the case of using an AlGaInN layer for the Lattice-matched layer (a step S4).

In particular, a crystal quality of a nitride to be deposited onto the ZnO single crystal substrate is preferably improved by substituting oxygen on the substrate surface with nitrogen, with supplying nitrogen radicals using a nitrogen plasma gun for 30 to 60 minutes at the substrate temperature of 500° C. approximately.

Meanwhile, an oxidation treatment is performed in the case of using an ZnMgBeCdO layer for the Lattice-matched layer (a step S4).

In particular, a crystal quality of an oxide to be deposited onto the ZnO single crystal substrate is preferably improved by being sufficiently filled with oxygen on the substrate surface, with supplying oxygen radicals using a oxygen plasma gun for 30 to 60 minutes at the substrate temperature of 500° C. approximately.

Next, a formation process of a Lattice-matched layer is performed (a step S5).

In this case, a growth temperature Tg for forming such the Lattice-matched layer 13 is to be less than 750° C. Moreover, the InGaN based active layer 15 is realized which comprises a uniform composition of the In, because crystal information, such as a plane orientation, a lattice constant, or the like, of the substrate is transferred to the lattice-matched based lower cladding layer 14 or the active layer 15 by depositing lattice-matched based materials for the Lattice-matched layer 13.

Specifically, the AlInN is deposited for example using a radio frequency plasma-assisted molecular beam epitaxy (RF-MBE) method comprising an RF radical cell to be able to supply group V materials as nitrogen radicals in the case of forming a nitride compound semiconductor of group III-V. In this case, deposition conditions are that the growth temperature Tg is between 400 and 750° C., a RF plasma power Pp is between 300 and 500 W, a nitrogen gas ($N_2$) flow rate Fr ($N_2$) is between 1 and 5 standard cc/min (sccm). Meanwhile, for materials of group III, high purity metal materials of Al and In are supplied to the substrate by evaporating from each Knudsen cell respectively.

Or, the InGaN is deposited using the RF-MBE method. In this case, deposition conditions are that the Tg is between 400 and 750° C., the Pp is between 300 and 500 W, the Fr ($N_2$) is between 1 and 5 sccm. Meanwhile, for materials of group III, high purity metal materials of In and Ga are supplied to the substrate by evaporating from each Knudsen cell respectively.

Or, the AlGaInN is deposited using the RF-MBE method. In this case, deposition conditions are that the Tg is between 400 and 750° C., the Pp is between 300 and 500 W, the Fr ($N_2$) is between 1 and 5 sccm. Meanwhile, for materials of group III, high purity metal materials of Al, Ga and In are supplied to the substrate by evaporating from each Knudsen cell respectively.

Meanwhile, the ZnO is deposited for example using the RF-MBE method in the case of forming a oxide compound semiconductor of group II-VI. In this case, deposition conditions are that the Tg is between 400 and 750° C., the Pp is between 300 and 500 W, the oxygen gas ($O_2$) flow rate Fr ($O_2$) is between 1 and 5 sccm. Moreover, for materials of group II, high purity metal material of Zn is supplied to the substrate by evaporating from a Knudsen cell.

Or, the ZnMgCdO is deposited using the RF-MBE method. In this case, deposition conditions are that the Tg is between 400 and 750° C., the Pp is between 300 and 500 W, the Fr ($O_2$) is between 1 and 5 sccm. Meanwhile, for materials of group II, high purity metal materials of Zn, Mg and Cd are supplied to the substrate by evaporating from each Knudsen cell respectively.

Or, the ZnMgBeCdO is deposited using the RF-MBE method. In this case, deposition conditions are that the Tg is between 400 and 750° C., the Pp is between 300 and 500 W, the Fr ($O_2$) is between 1 and 5 sccm. Meanwhile, for materials of group II, high purity metal materials of Zn, Mg, Be and Cd are supplied to the substrate by evaporating from each Knudsen cell respectively.

Next, a formation process of a lattice-matched based lower cladding layer is performed (a step S6).

This lattice-matched based lower cladding layer 14 is designed to be set the refractive index as lower comparing to that of the InGaN based active layer 15 which will be described below.

In this case, the growth temperature Tg for forming such the lattice-matched based lower cladding layer 14 is to be less than 750° C. Moreover, the InGaN based active layer 15 is realized which comprises a uniform composition of the In, because crystal information, such as the plane orientation, the lattice constant, or the like, of the substrate is transferred to the active layer 15 by depositing lattice-matched based materials for the lattice-matched based lower cladding layer 14.

Specifically, the AlGaInN or the InGaN is deposited for example using the RF-MBE method or a gas source MBE (GS-MBE) method with an ammonia ($NH_3$) as a group V material. In the case of using the RF-MBE method, deposition conditions are that the Tg is between 400 and 750° C., the Pp is between 300 and 500 W, the nitrogen gas ($N_2$) flow rate Fr ($N_2$) is between 1 and 5 sccm. Meanwhile, in the case of using the GS-MBE method, deposition conditions are that the Tg is between 400 and 750° C., the ammonia gas ($NH_3$) flow rate Fr ($NH_3$) is between 10 and 100 sccm. Moreover, for materials of group III, high purity metal materials are supplied to the substrate by evaporating from each Knudsen cell respectively.

Or, the ZnMgBeCdO or the ZnMgBeO is deposited for example using the RF-MBE method or the GS-MBE method. In the case of using the RF-MBE method, deposition conditions are that the Tg is between 400 and 750° C., the Pp is between 300 and 500 W, the oxygen gas ($O_2$) flow rate Fr ($O_2$) is between 1 and 5 sccm. Meanwhile, in the case of using the GS-MBE method, deposition conditions are that the Tg is between 400 and 750° C., the Fr ($O_2$) is between 10 and 100 sccm. Moreover, for materials of group II, high purity metal materials are supplied to the substrate by evaporating from each Knudsen cell respectively.

Next, a formation process of an InGaN based active layer is performed (a step S7).

In this case, the growth temperature Tg for forming such the InGaN based active layer 15 is to be less than 750° C.

Specifically, an InGaN well layer/InGaN barrier layer or an InGaN well layer/AlInN barrier layer is deposited for example using the RF-MBE method or the GS-MBE method. In the case of using the RF-MBE method, deposition conditions are that the Tg is between 400 and 750° C., the Pp is between 300 and 500 W, the Fr ($N_2$) is between 1 and 5 sccm. Meanwhile, in the case of using the GS-MBE method, deposition conditions are that the Tg is between 400 and 750° C., the Fr ($NH_3$) is between 10 and 100 sccm. Moreover, for materials of group III, high purity metal materials are supplied to the substrate by evaporating from each Knudsen cell respectively.

Next, a formation process of a lattice-matched based upper cladding layer is performed (a step S8).

In this case, the growth temperature Tg for forming such the lattice-matched based upper cladding layer 16 is to be less than 750° C.

Specifically, the AlGaInN is deposited for example using the RF-MBE method or the GS-MBE method. In the case of using the RF-MBE method, deposition conditions are that the Tg is between 400 and 750° C., the Pp is between 300 and 500 W, the Fr ($N_2$) is between 1 and 5 sccm. Meanwhile, in the case of using the GS-MBE method, deposition conditions are that the Tg is between 400 and 750° C., the Fr ($NH_3$) is between 10 and 100 sccm. Moreover, for materials of group III, high purity metal materials are supplied to the substrate by evaporating from each Knudsen cell respectively.

Next, a formation process of a p-type contact layer is performed (a step S9).

In this case, the growth temperature Tg for forming such the p-type contact layer 17 is to be less than 750° C.

Specifically, the GaN or the InGaN is deposited for example using the RF-MBE method or the GS-MBE method. In the case of using the RF-MBE method, deposition conditions are that the Tg is between 400 and 750° C., the Pp is between 300 and 500 W, the Fr ($N_2$) is between 1 and 5 sccm. Meanwhile, in the case of using the GS-MBE method, deposition conditions are that the Tg is between 400 and 750° C., the Fr ($NH_3$) is between 10 and 100 sccm. Moreover, for materials of group III, high purity metal materials are supplied to the substrate by evaporating from each Knudsen cell respectively.

Here, a magnesium (Mg), a beryllium (Be), the Mg and a silicon (Si) codoped, or the like, is used for a p-type dopant.

Additionally, it may also able to perform further processes for forming other layers at the high temperature of not less than 750° C. after depositing the nitride onto the ZnO single crystal substrate 12.

Thus, it becomes possible to manufacture with a high yield regarding an epitaxial wafer for semiconductor laser diodes in a visible light range with a long wavelength, such as in a green light range, following the above mentioned processes.

Figure 10:
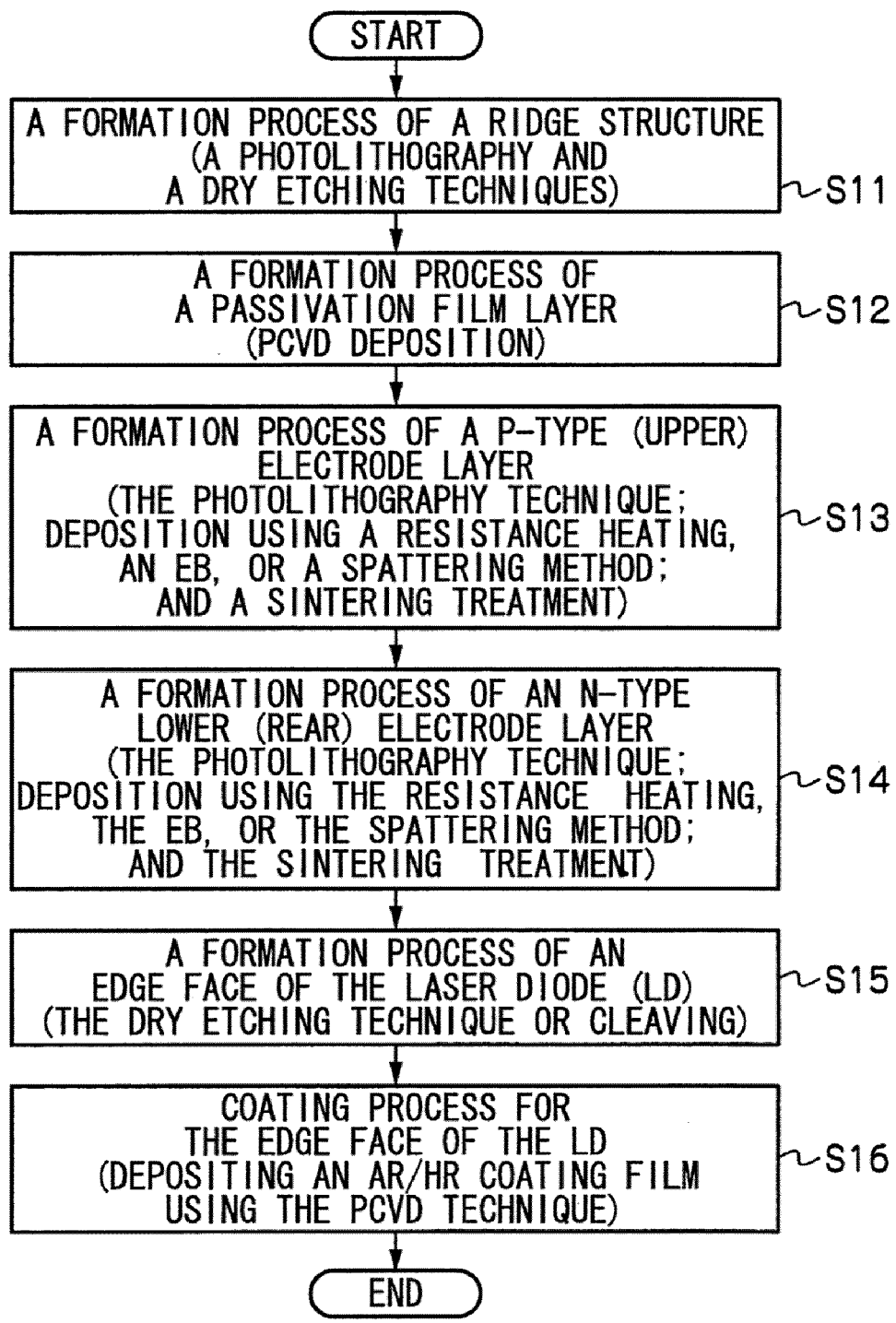
FIG. 10 is a process flow diagram of a semiconductor laser diode in a visible light range with a long wavelength, such as in a green light range.

FIG. 10 is a process flow diagram of a semiconductor laser diode in a visible light range with a long wavelength, such as in a green light range.

First, a formation process of a ridge structure is performed (a step S11).

Using the ridge structure as one kind of semiconductor laser structures, it is able to realize a real valued refractive index waveguide structure for being possible to decrease an optical loss through an optical waveguide (a path for a laser light). It is relatively a simple structure, however, it becomes necessary to control precisely regarding processing techniques thereof, for maintaining a stable oscillation mode of the laser light.

In particular, the ridge structure is to be formed using a photolithography and a dry etching techniques.

Next, a formation process of a passivation film layer is performed (a step S12).

Such the passivation film layer 18 functions as the overcoat. Here, it is formed by depositing a silicon dioxide ($SiO_2$) and/or a zirconium dioxide ($ZrO_2$) using a plasma chemical vapor deposition (PCVD) method.

Next, a formation process of a p-type upper electrode layer is performed (a step S13).

Specifically, forming an electrode pattern using the lithography technique; removing the passivation layer 18; depositing an electrode metal using a resistance heating, an electron beam (EB), or a spattering method; and processing a sintering treatment. In this case, the formed p-type upper electrode layer 19 becomes to be ohmic contacted with the p-type contact layer 17.

Next, a formation process of an n-type lower electrode layer is performed for a rear side of a wafer manufactured using the above mentioned method of manufacturing the epitaxial wafer for semiconductor laser diodes in a visible light range with a long wavelength, such as in a green light range or the like (a step S14).

Specifically, an electrode is formed as the n-type lower electrode layer 11, such as for example Ti/Al, Ti/Pt/Au, or the like, by the following steps of: forming an electrode pattern using the lithography technique; depositing an electrode metal using the resistance heating, the EB, or the spattering method; and processing the sintering treatment. In this case, the formed n-type lower electrode layer 11 becomes to be ohmic contacted with the ZnO single crystal substrate 12. Additionally, it is preferable to polish the ZnO single crystal substrate 12 to be thinner by a chemical mechanical polishing (CMP) treatment before forming the lower electrode layer 11.

Next, a formation process of an edge face of the laser diode is performed (a step S15).

Specifically, the formation process of the edge face of the laser diode is performed using the dry etching technique or cleaving.

Next, a coating process is performed for the edge face of the laser diode (a step S16).

Thus, all the processes are end for manufacturing the green emission semiconductor laser diode.

According to the InGaN based active layer 15 of the first embodiment, the light emission is able to be performed in the green light range, as the band gap energy becomes 2.2 eV.

According to the present embodiment as described above, it becomes possible to manufacture the InGaN based semiconductor light emitting element, that is to say, the semiconductor laser diode that comprises every element with the uniform in composition distribution and with the high Indium (In) composition, with decreasing adverse effects from the piezo electric field, but with the high luminescent efficiency.

Next, more specific examples of the present embodiment will be described in detail below.

In the below description, an optical guiding layer is necessary for the case that the semiconductor light emitting element comprises a separate confinement heterostructure (SCH), otherwise it is not necessary to be provided for other structures.

Example 1

First, a configuration of a semiconductor light emitting element of (Example 1) will be described in detail below.

The semiconductor light emitting element of (Example 1) comprises the following configuration.

| | |
|---|---|
| p-type electrode: | ohmic contact, Ni/Au or Pd/Pt/Au; |
| p-type contact layer: | p-type high carrier density (e.g. Mg dope), InGaN; |
| p-type cladding layer: | lattice-matched with the active layer, AlGaInN; |

| | |
|---|---|
| optical guiding layer: | for confining light, AlGaInN; |
| active layer: | the In composition ratio in the well layer: ≧20%, InGaN/InGaN quantum well (QW); |
| optical guiding layer: | for confining light, AlGaInN or ZnMgBeCdO; |
| n-type cladding layer: | lattice-matched with the active layer, AlGaInN and/or ZnMgBeCdO (including any one of an AlGaInN single layer, a ZnMgBeCdO single layer and double layers of AlGaInN and ZnMgBeCdO, ditto hereinafter); |
| Lattice-matched layer: | lattice-matched with the substrate, AlGaInN and/or ZnMgBeCdO, AlGaInN superlattice may be also available; |
| substrate: | ZnO single crystal substrate, a-plane ((11$\bar{2}$0) plane), m-plane ((1$\bar{1}$00) plane), c-plane ((0001) plane), r-plane ((11$\bar{2}$2) plane) inclined from the a-plane, or (10$\bar{1}\bar{1}$) plane; |
| n-type electrode layer: | ohmic contact, Ti/Al or Ti/Pt/Au. |

Example 2

Next, a configuration of a semiconductor light emitting element of (Example 2) will be described in detail below.

The semiconductor light emitting element of (Example 2) comprises the following configuration.

| | |
|---|---|
| p-type electrode: | ohmic contact, Ni/Au or Pd/Pt/Au; |
| p-type contact layer: | p-type high carrier density (e.g. Mg dope), InGaN; |
| p-type cladding layer: | lattice-matched with the active layer, AlGaInN; |
| optical guiding layer: | for confining light, AlGaInN; |
| active layer: | the Indium (In) composition in the well layer: ≧20%, InGaN/InGaN QW; |
| optical guiding layer: | for confining light, AlGaInN or ZnMgBeCdO; |
| n-type cladding layer: | lattice-matched with the active layer, AlGaInN and/or ZnMgBeCdO; |
| Lattice-matched layer: | lattice-matched with the substrate, InGaN and/or ZnMgBeO, AlGaInN superlattice may be also available; |
| substrate: | ZnO single crystal substrate, a-plane ((11$\bar{2}$0) plane), m-plane ((1$\bar{1}$00) plane), c-plane ((0001) plane), r-plane ((11$\bar{2}$2) plane) inclined from the a-plane, or (10$\bar{1}\bar{1}$) plane; |
| n-type electrode layer: | ohmic contact, Ti/Al or Ti/Pt/Au. |

Example 3

Next, a configuration of a semiconductor light emitting element of (Example 3) will be described in detail below.

The semiconductor light emitting element of (Example 3) comprises the following configuration.

| | |
|---|---|
| p-type electrode: | ohmic contact, Ni/Au or Pd/Pt/Au; |
| p-type contact layer: | p-type high carrier density (e.g. Mg dope), InGaN; |
| p-type cladding layer: | lattice-matched with the active layer, AlInN; |
| optical guiding layer: | for confining light, AlInN; |
| active layer: | the Indium (In) composition in the well layer: ≧20%, InGaN/InGaN QW; |
| optical guiding layer: | for confining light, AlGaInN or ZnMgBeCdO; |
| n-type cladding layer: | lattice-matched with the active layer, AlInN and/or ZnMgBeO; |
| Lattice-matched layer: | lattice-matched with the substrate, InGaN and/or ZnMgBeO, AlGaInN superlattice may be also available; |
| substrate: | ZnO single crystal substrate, a-plane ((11$\bar{2}$0) plane), m-plane ((1$\bar{1}$00) plane), c-plane ((0001) plane), r-plane ((11$\bar{2}$2) plane) inclined from the a-plane, or (10$\bar{1}\bar{1}$) plane; |
| n-type electrode layer: | ohmic contact, Ti/Al or Ti/Pt/Au. |

Example 4

Next, a configuration of a semiconductor light emitting element of (Example 4) will be described in detail below.

The semiconductor light emitting element of (Example 4) comprises the following configuration.

| | |
|---|---|
| p-type electrode: | ohmic contact, Ni/Au or Pd/Pt/Au; |
| p-type contact layer: | p-type high carrier density (e.g. Mg dope), InGaN; |
| p-type cladding layer: | lattice-matched with the active layer, AlGaInN; |
| optical guiding layer: | for confining light, AlGaInN; |
| active layer: | the Indium (In) composition in the well layer: ≧20%, InGaN/InGaN QW; |
| optical guiding layer: | for confining light, AlInN or ZnMgBeO; |
| n-type cladding layer: | lattice-matched with the active layer, AlInN and/or ZnMgBeO; |
| Lattice-matched layer: | lattice-matched with the substrate, InGaN and/or ZnMgBeO, AlGaInN superlattice may be also available; |
| substrate: | ZnO single crystal substrate, a-plane ((11$\bar{2}$0) plane), m-plane ((1$\bar{1}$00) plane), c-plane ((0001) plane), r-plane ((11$\bar{2}$2) plane) inclined from the a-plane, or (10$\bar{1}\bar{1}$) plane; |
| n-type electrode layer: | ohmic contact, Ti/Al or Ti/Pt/Au. |

Example 5

Next, a configuration of a semiconductor light emitting element of (Example 5) will be described in detail below.

The semiconductor light emitting element of (Example 5) comprises the following configuration.

| | |
|---|---|
| p-type electrode: | ohmic contact, Ni/Au or Pd/Pt/Au; |
| p-type contact layer: | p-type high carrier density (e.g. Mg dope), InGaN; |

| | |
|---|---|
| p-type cladding layer: | lattice-matched with the active layer, AlGaInN; |
| optical guiding layer: | for confining light, AlGaInN; |
| active layer: | the Indium (In) composition in the well layer: ≧20%, InGaN/InGaN QW; |
| optical guiding layer: | for confining light, AlGaInN or ZnMgBeCdO; |
| n-type cladding layer: | lattice-matched with the active layer, AlGaInN and/or ZnMgBeCdO; |
| Lattice-matched layer: | lattice-matched with the substrate, AlInN and/or ZnMgBeO, AlGaInN superlattice may be also available; |
| substrate: | ZnO single crystal substrate, a-plane ((11$\bar{2}$0) plane), m-plane ((1$\bar{1}$00) plane), c-plane ((0001) plane), r-plane ((11$\bar{2}$2) plane) inclined from the a-plane, or (10$\bar{1}\bar{1}$) plane; |
| n-type electrode layer: | ohmic contact, Ti/Al or Ti/Pt/Au. |

Example 6

Next, a configuration of a semiconductor light emitting element of (Example 6) will be described in detail below.

The semiconductor light emitting element of (Example 6) comprises the following configuration.

| | |
|---|---|
| p-type electrode: | ohmic contact, Ni/Au or Pd/Pt/Au; |
| p-type contact layer: | p-type high carrier density (e.g. Mg dope), InGaN; |
| p-type cladding layer: | lattice-matched with the active layer, AlGaInN; |
| optical guiding layer: | for confining light, AlGaInN; |
| active layer: | the Indium (In) composition in the well layer: ≧20%, InGaN/InGaN QW; |
| optical guiding layer: | for confining light, AlGaInN or ZnMgBeCdO; |
| n-type cladding layer: | lattice-matched with the active layer, AlInN and/or ZnMgBeO; |
| Lattice-matched layer: | lattice-matched with the substrate, AlInN and/or ZnMgBeO, AlGaInN superlattice may be also available; |
| substrate: | ZnO single crystal substrate, a-plane ((11$\bar{2}$0) plane), m-plane ((1$\bar{1}$00) plane), c-plane ((0001) plane), r-plane ((11$\bar{2}$2) plane) inclined from the a-plane, or (10$\bar{1}\bar{1}$) plane; |
| n-type electrode layer: | ohmic contact, Ti/Al or Ti/Pt/Au. |

Example 7

Next, a configuration of a semiconductor light emitting element of (Example 7) will be described in detail below.

The semiconductor light emitting element of (Example 7) comprises the following configuration.

| | |
|---|---|
| p-type electrode: | ohmic contact, Ni/Au or Pd/Pt/Au; |
| p-type contact layer: | p-type high carrier density (e.g. Mg dope), InGaN; |

| | |
|---|---|
| p-type cladding layer: | lattice-matched with the active layer, AlGaInN; |
| optical guiding layer: | for confining light, AlGaInN; |
| active layer: | the Indium (In) composition in the well layer: ≧20%, InGaN/InGaN QW; |
| optical guiding layer: | for confining light, AlInN or ZnMgBeO; |
| n-type cladding layer: | lattice-matched with the active layer, AlGaInN and/or ZnMgBeCdO; |
| Lattice-matched layer: | lattice-matched with the substrate, AlInN and/or ZnMgBeO, AlGaInN superlattice may be also available; |
| substrate: | ZnO single crystal substrate, a-plane ((11$\bar{2}$0) plane), m-plane ((1$\bar{1}$00) plane), c-plane ((0001) plane), r-plane ((11$\bar{2}$2) plane) inclined from the a-plane, or (10$\bar{1}\bar{1}$) plane; |
| n-type electrode layer: | ohmic contact, Ti/Al or Ti/Pt/Au. |

Example 8

Next, a configuration of a semiconductor light emitting element of (Example 8) will be described in detail below.

The semiconductor light emitting element of (Example 8) comprises the following configuration.

| | |
|---|---|
| p-type electrode: | ohmic contact, Ni/Au or Pd/Pt/Au; |
| p-type contact layer: | p-type high carrier density (e.g. Mg dope), InGaN; |
| p-type cladding layer: | lattice-matched with the active layer, AlGaInN; |
| optical guiding layer: | for confining light, AlGaInN; |
| active layer: | the Indium (In) composition in the well layer: ≧20%, InGaN/InGaN QW; |
| optical guiding layer: | for confining light, AlInN or ZnMgBeO; |
| n-type cladding layer: | lattice-matched with the active layer, AlInN and/or ZnMgBeO; |
| Lattice-matched layer: | lattice-matched with the substrate, AlInN and/or ZnMgBeO, AlGaInN superlattice may be also available; |
| substrate: | ZnO single crystal substrate, a-plane ((11$\bar{2}$0) plane), m-plane ((1$\bar{1}$00) plane), c-plane ((0001) plane), r-plane ((11$\bar{2}$2) plane) inclined from the a-plane, or (10$\bar{1}\bar{1}$) plane; |
| n-type electrode layer: | ohmic contact, Ti/Al or Ti/Pt/Au. |

The active layer is comprised of the quantum well (QW) structure of the InGaN well layer/AlInN barrier layer or the InGaN well layer/GaN barrier layer in (Example 1) to (Example 8). Moreover, the ZnO single crystal substrate has the substrate surface as the plane orientation insusceptible to the piezo electric field.

According to the above described every example, it is able to decrease threading dislocations, not only to suppress the phase separation but also to suppress the piezo electric field even with the high Indium (In) composition, and to improve the luminescent efficiency, at this time of obtaining the oscillation wavelength in the visible light range with the wavelength of 480 nm or longer, such as in the green light range or the like.

The Second Embodiment

Figure 11:
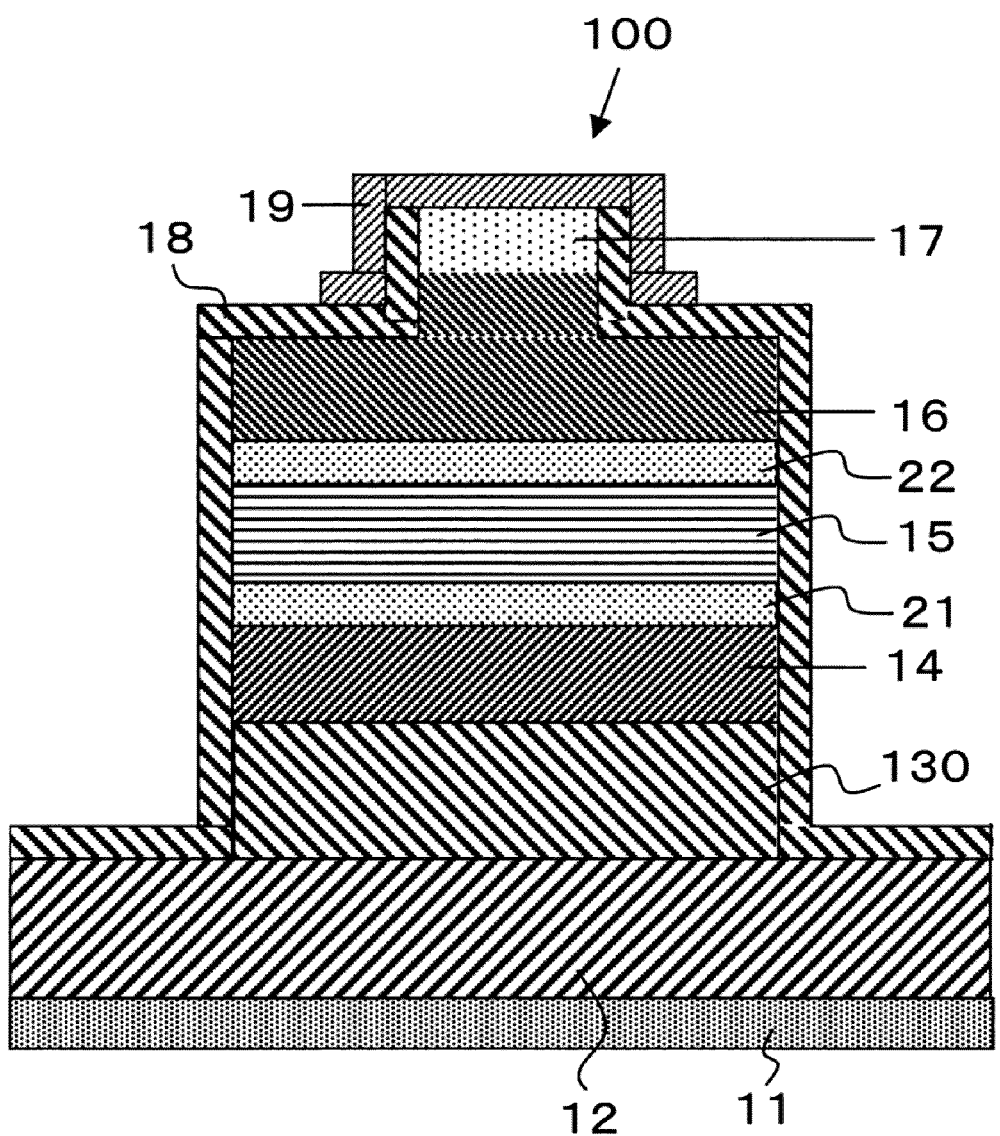
FIG. 11 is a cross sectional view showing a brief configuration of a semiconductor laser diode according to the second embodiment of the present invention.

Next, a semiconductor laser diode 100 as a semiconductor light emitting element according to the second embodiment of the present invention will be described in detail below, based on FIG. 11 to FIG. 14. FIG. 11 is a cross sectional view showing a brief configuration of the semiconductor laser diode 100 according to the second embodiment.

The semiconductor laser diode 100 comprises: the ZnO single crystal substrate 12; and a Pseudo-morphic layer 130, the lattice-matched based lower cladding layer 14, an optical guiding layer 21, the InGaN based active layer 15, an optical guiding layer 22, the lattice-matched based upper cladding layer 16 and the contact layer 17, formed in order on the ZnO single crystal substrate 12; as shown in FIG. 11. Moreover, the semiconductor laser diode 100 comprises the lower electrode layer 11 formed on the rear surface side of the ZnO single crystal substrate 12, the passivation film layer 18 and the upper electrode layer 19. Here, in the semiconductor light emitting element according to the present embodiment, the Pseudo-morphic layer 130 may be unnecessary in case the lower cladding layer 14 has a function combined with the Lattice-matched layer lattice-matched with the ZnO single crystal substrate 12.

In such the semiconductor laser diode 100, an epitaxial wafer is comprised of the Pseudo-morphic layer 130, the lattice-matched based lower cladding layer 14, the optical guiding layer 21, the InGaN based active layer 15, the optical guiding layer 22, the lattice-matched based upper cladding layer 16 and the contact layer 17 formed in order on the ZnO single crystal substrate 12, which is for semiconductor laser diodes to emit in the visible light range with the long wavelength, such as in the green light range or the like. Moreover, according to the present embodiment, the epitaxial wafer is formed on a c-plane ((000$\bar{1}$) plane) as an oxygen polar (O-polar) of the ZnO single crystal substrate 12.

The Pseudo-morphic layer 130 is to be formed of GaN with a thickness of not less than one monolayer (ML), but not more than a critical thickness for the ZnO single crystal substrate 12 (hereinafter, it is simply described as ZnO substrate 12), which is formed between the ZnO substrate 12 and the active layer 15. Moreover, the Pseudo-morphic layer 130 has a function of an n-type conductivity by being doped a silicon (Si).

Figure 12:
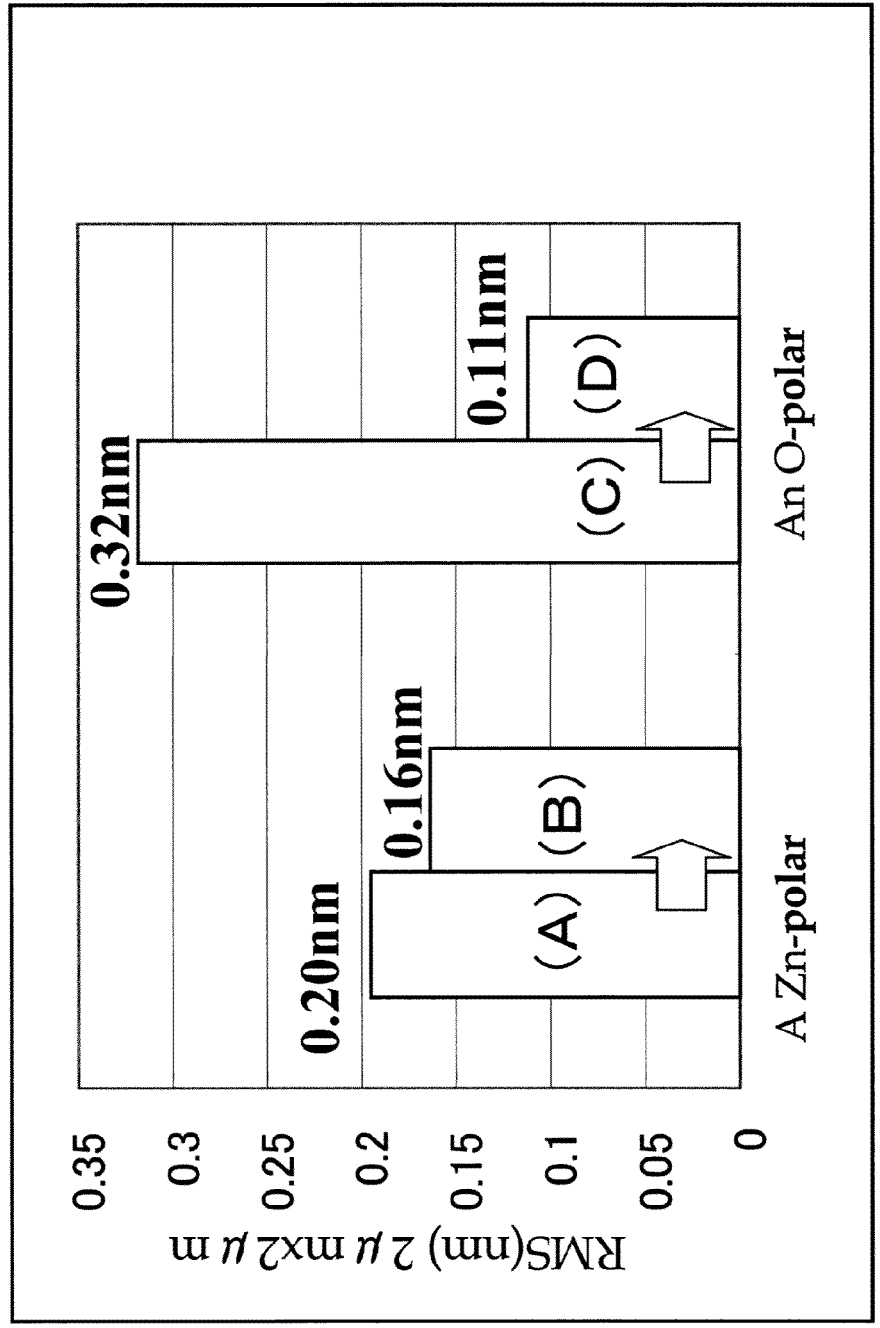
FIG. 12 is a graph showing a relative surface roughness in root mean square (RMS) after a CMP process or after a heat treatment on a $\bar{c}$-plane (($000\bar{1}$) plane) as an oxygen polar (O-polar) of a ZnO substrate, and on a c-plane ($0001$) as an zinc polar (Zn-polar) of a ZnO substrate, respectively.
Figure 13:
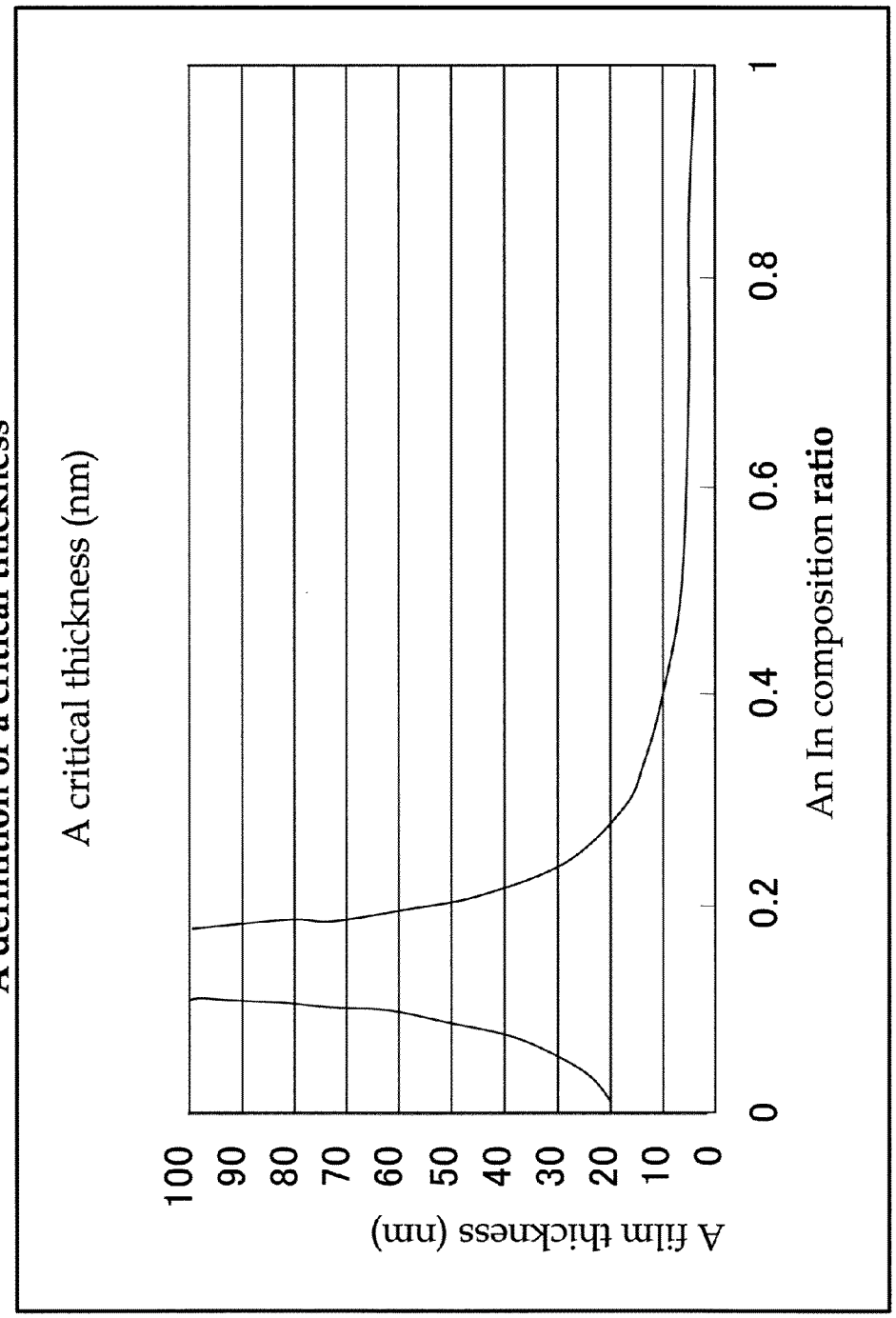
FIG. 13 is a graph showing a critical thickness corresponding to an Indium (In) composition.

Here, such the so-called critical thickness is evaluated by calculating a film thickness of a layer how thick to be grown onto the ZnO substrate 12 (refer to FIG. 13). Hence, the critical thickness of the Pseudo-morphic layer 130 of GaN is approximately 20 nm at a maximum, according to FIG. 12. However, the critical thickness is possible to be thicker as approximately 50 nm for the critical thickness of the Pseudo-morphic layer 130 of GaN, with taking into consideration of the upper layers to be formed onto the Pseudo-morphic layer 130, such as the active layer 15 of InGaN or the like. Thus, it is possible to set the critical thickness of the Pseudo-morphic layer 130 of GaN in a range between 1 ML and 50 nm, however, it is further favorable to be set in a range of not less than 1 ML but not more than 20 nm.

The lattice-matched based lower cladding layer 14 is lattice-matched with the active layer 15 and/or the ZnO substrate 12, and formed of AlGaInN by growing onto the Pseudo-morphic layer 130, with being lattice-matched with the active layer 15 and/or the ZnO substrate 12. Here, the lower cladding layer 14 has the function of the n-type conductivity by Si doping.

The optical guiding layer 21 is formed by growing an InGaN crystal onto the lower cladding layer 14. Moreover, the optical guiding layer 21 has the function of the n-type conductivity by Si doping.

The InGaN based active layer 15 is formed by growing an indium gallium nitride ($In_xGa_{1-x}N$, 0<x<1) crystal (InGaN layer) onto the optical guiding layer 21. In such the active layer 15, the Indium (In) composition is set to be for the emission wavelength of not less than 480 nm. Specifically, the active layer 15 is comprised of the InGaN layer for the emission wavelength in the green light range, with the Indium (In) composition of ≧20%. Here, the Indium (In) composition is designed as approximately 30% regarding the present embodiment.

The optical guiding layer 22 is formed by growing the InGaN crystal onto the similar InGaN based active layer 15. Moreover, the optical guiding layer 22 has a function of an p-type conductivity by being doped a magnesium (Mg).

The upper cladding layer 16 is formed by growing an AlGaInN crystal onto the optical guiding layer 22 lattice-matched with the active layer 15 and/or the ZnO substrate 12. Here, the upper cladding layer 16 has a function of the p-type conductivity by Mg doping.

And, the contact layer 17 is formed onto the upper cladding layer 16, by supplying nitrogen (N) radicals together with the materials of Ga and In from the corresponding cells with optimally set temperatures respectively. Here, the contact layer 17 has the function of the p-type conductivity by being supplied the Mg, that is to say, the contact layer 17 is doped to p-type.

The aspects of the semiconductor laser diode 100 according to the second embodiment comprising the above mentioned configuration will be summarized below.

1. The zinc oxide (ZnO) single crystal substrate 12 is used.
2. The Pseudo-morphic layer 130 is provided therein, which is formed between the ZnO substrate 12 and the active layer 15.
3. The Pseudo-morphic layer 130 is formed of GaN, with the thickness of not less than one monolayer (ML), but not more than the critical thickness for the ZnO substrate 12.

Next, a method of manufacturing the semiconductor laser diode 100 comprising the above mentioned configuration will be described in detail below.

Here, in the present embodiment, the above mentioned epitaxial wafer for semiconductor laser diodes to emit in the visible light range with the long wavelength, such as in the green light range or the like, is formed on the c̄-plane ((000$\bar{1}$) plane) as the O-polar of the ZnO substrate 12, by the following processes described below, with using the RF-MBE method.

(Process 1)

First, the ZnO substrate 12 is prepared, and substrate surface treatments are performed for the ZnO substrate 12. Regarding the substrate surface treatments, a surface flattening process, a surface cleaning process and a surface modification process are performed thereon, as described in detail below.

(Process 1a)

In the surface flattening process, first a CMP process is performed for the ZnO substrate 12, next a heat treatment is performed in an air atmosphere to form a stepped terrace structure for the c̄-plane ((000$\bar{1}$) plane) as the O-polar of the ZnO substrate 12. At the period of this process, it is desirable to perform in a condition that the substrate is sandwiched between flat plates of inorganic construction materials, such as the zirconium oxide (zirconia), the zinc oxide, or the like.

It is desirable to perform in the heat treatment condition at the temperature of between 1000 and 1300° C. for one to five hours. After such the surface flattening process, a high melting metal, such as molybdenum (Mo) or the like, is deposited onto the rear surface of the c-plane ((000$\bar{1}$) plane) as the O-polar of the ZnO substrate 12, using such as the spattering method, the EB method, or the like, and it is introduced into a growth chamber.
(Process 1b)

Regarding the surface cleaning process, a thermal cleaning treatment is performed in the growth chamber under atmospheric pressure or diminished pressure. In particular, organic impurities and the like are removed by performing a heat treatment for the ZnO substrate 12 at a temperature of between 800 and 850° C. for 10 to 60 minutes.

Or, both of the cleaning treatment of the ZnO substrate 12 and the surface reconstruction of the ZnO substrate 12 are performed to be able to observe a streak pattern by a reflection high energy electron diffraction (RHEED) measurement, after the heat treatment at a high temperature of 1000° C. for 30 minutes approximately as the thermal cleaning condition. In such the case of cleaning the ZnO substrate 12, it is desirable to be performed in an oxygen atmosphere or with being exposed to an oxygen plasma.
(Process 1c)

In the surface modification process performed after the surface cleaning process, the nitridation treatment is performed for forming the Pseudo-morphic layer 130 of GaN on the ZnO substrate 12. Specifically, the crystal quality of the nitride to be deposited onto the ZnO substrate 12 is preferably improved by substituting oxygen on the substrate surface with nitrogen, with supplying nitrogen radicals using a nitrogen plasma gun for 30 to 60 minutes at the substrate temperature of 500° C. approximately.
(Process 2)

Next, the Pseudo-morphic layer 130 is formed by growing the GaN crystal layer with a thickness of 4 ML on the c-plane ((000$\bar{1}$) plane) as the O-polar of the ZnO substrate 12, by supplying the Ga and the nitrogen (N) radicals together at a temperature of lower than 750° C., for example 500° C. approximately.

For suppressing an interface reaction between the ZnO substrate 12 and the Pseudo-morphic layer 130 of GaN, it is required to perform the growth of the GaN crystal at the low temperature. For forming the Pseudo-morphic layer 130, it may be also available that the InN crystal layer is grown as 1 ML after growing the GaN crystal layer of 4 ML, the GaN crystal layer is grown as 4 ML after growing the InN crystal layer of 1 ML, or the GaN crystal layer and the InN crystal layer are alternately grown to be laminated as a multilayer structure.

Moreover, it is able to maintain the lattice constant of the ZnO substrate 12, by designing the total film thickness of the GaN crystal layer and the InN crystal layer comprising the Pseudo-morphic layer 130 to be not more than the critical thickness of an InGaN layer having an average composition of such the GaN layer and the InN layer, even there are existed a difference of approximately 1.8% between the lattice constant of the ZnO substrate 12 and that of the GaN crystal layer and a difference of approximately 8.8% between the lattice constant of the ZnO substrate 12 and that of the InN crystal layer corresponding to the a-axis respectively. Furthermore, the Pseudo-morphic layer 130 is formed to have the function of the n-type conductivity by Si doping thereinto.

Additionally, it may also improve the crystalline of layers formed at the upper part of the Pseudo-morphic layer 130 by performing a heat treatment at a temperature of between 700 and 1000° C. for 30 minutes to 2 hours, after growing the GaN crystal layer at the low temperature of 500° C. approximately, because the crystalline of the Pseudo-morphic layer 130 is progressed during the heat treatment which is comprised of the GaN thin film deposited at the low temperature, as the streak pattern becomes appeared gradually. However, it is necessary to perform the heat treatment at the optimum temperature (the crystalline of the Pseudo-morphic layer 130), because the $Ga_2ZnO_4$ cannot help but be formed in the case of growing the GaN crystal layer at excessively high temperature due to being diffused the Ga into the ZnO substrate 12.
(Process 3)

Next, the lattice-matched based lower cladding layer 14 is formed by growing the AlGaInN crystal layer lattice-matched with the InGaN based active layer 15 and/or the ZnO substrate 12, by supplying the N radicals together with the materials of In, Ga and Al from the corresponding cells with optimally set temperatures respectively, with setting the growth temperature as lower than 750° C., at approximately 450° C. for example. Such the AlGaInN crystal layer may be matched for the lattice constant corresponding to the a-axis, as it is grown on the c-plane as the O-polar of the ZnO substrate 12. Moreover, such the lower cladding layer 14 may have the function of the n-type conductivity by Si doping at the period of growing thereof.

Thus, according to the present embodiment, the lower cladding layer 14 is formed of an aluminum gallium indium nitride ($Al_{1-p-q}Ga_pIn_qN$, $0 \leq p<1$, $0 \leq q<1$, $p+q \leq 1$). Moreover, it may also available for the lower cladding layer 14 to be comprised of a zinc magnesium beryllium cadmium oxide ($Zn_{1-a-b-c}Mg_aBe_bCd_cO$, $0 \leq a<1$, $0 \leq b<1$, $0 \leq c<1$, $a+b+c \leq 1$) including the ZnO, instead of the AlGaInN.
(Process 4)

Next, the optical guiding layer 21 is formed by growing the InGaN crystal layer on the lower cladding layer 14, by supplying the materials of In together with the Ga and the N radicals at the growth temperature as lower than 750° C., at the similar 450° C. for example. In this case, it is able to grow the preferred InGaN crystal layer, by designing the Indium (In) composition of the InGaN crystal layer as between that of the lower cladding layer 14 and that of the active layer 15. Moreover, the optical guiding layer 21 of InGaN may have the function of the n-type conductivity by supplying the Si at the period of growing thereinto.
(Process 5)

Next, the InGaN based active layer 15 is formed of InGaN with the Indium (In) composition as approximately 30% for comprising the emission wavelength in the green light range, by supplying the materials of In and Ga together with the N radicals with the optimum In/Ga ratio and the optimum ratio between the group V and the group III (V/III ratio), after resetting the cell temperature or after replacing with preset cells for the In and the Ga if comprising a plurality of cells, with the growth temperature as lower than 750° C., at the similar 450° C. for example.
(Process 6)

Next, the optical guiding layer 22 of InGaN is formed on the InGaN based active layer 15, with the Indium (In) composition of the InGaN as between that of the active layer 15 and that of the upper cladding layer 16, by supplying the materials of In and Ga together with the N radicals with the optimum In/Ga ratio and the optimum V/III ratio, after resetting the cell temperature or after replacing with preset cells for the In and the Ga if comprising a plurality of cells, with the growth temperature as lower than 750° C., at the similar 450° C. for example. Moreover, the optical guiding layer 22 may have the function of the p-type conductivity by Mg doping at the period of growing the InGaN layer thereinto.
(Process 7)

Next, the lattice-matched based upper cladding layer 16 is formed by growing the AlGaInN crystal layer lattice-matched with the InGaN based active layer 15 and/or the ZnO substrate 12, or the AlInN crystal layer lattice-matched with the ZnO substrate 12 and/or the optical guiding layer 22 of InGaN, by supplying the N radicals together with the materials of In, Al and/or Ga from the corresponding cells with optimally set temperatures respectively, with setting the growth temperature as lower than 750° C., at the similar 450° C. for example. Moreover, the upper cladding layer 16 may have the function of the p-type conductivity by Mg doping at the period of growing the layer thereinto.
(Process 8)

At the last, the contact layer 17 is formed by supplying the N radicals together with the materials of Ga and In from the corresponding cells with optimally set temperatures respectively. At this time of forming thereof, it may have the function of the p-type conductivity by supplying Mg at the same period therewith.

Additionally, it may also available for the p-type dopant in the above mentioned processes to use the Be, the Mg and the Si codoped, or the like, instead of the Mg.

Furthermore, it is able to activate the Mg in the Mg doped layer to have the function of the p-type conductivity by a heat treatment at a high temperature as an Mg activation annealing, after finishing the epitaxial growth and taking out the substrate form the growth chamber or the vacuum chamber.

Thus, it becomes possible to manufacture the epitaxial wafer for the semiconductor laser diode 100 to emit in the visible light range with the long wavelength, such as in the green light range, following the above described (Process 1) through (Process 8).

Additionally, it may also able to perform further processes for forming other layers at the high temperature of not less than 750° C. after depositing the nitride onto the ZnO single crystal substrate 12.

Next is a description regarding processes for manufacturing a laser diode structure of the semiconductor laser diode 100, with using the above manufactured epitaxial wafer.
(Process 9)

A formation of a ridge structure is performed.

Using the ridge structure as one kind of semiconductor laser structures, it is able to realize the real valued refractive index waveguide structure for being possible to reduce the optical loss through the optical waveguide. It is relatively the simple structure, however, it becomes necessary to control precisely regarding processing techniques thereof, for maintaining a stable oscillation mode of the laser light. In particular, the ridge structure is to be formed using the photolithography and the dry etching techniques.
(Process 10)

Next, a passivation film layer is formed.

Such the passivation film layer 18 functions as the overcoat. Here, it is formed by depositing the $SiO_2$ and/or the $ZrO_2$ using the PCVD method.
(Process 11)

Next, an electrode is formed as the upper electrode layer 19. Here, it is considered that the contact layer 17 has the function of the p-type conductivity as in the case thereof.

Specifically, the upper electrode layer 19 is formed, such as for example Ni/Au, Pd/Pt/Au, or the like, as having the function of the p-type conductivity by the following steps of: forming the electrode pattern using the lithography technique; removing the passivation layer 18; depositing the electrode metal using the resistance heating, the EB, or the spattering method; and processing a sintering treatment. In such the case, the formed p-type upper electrode layer 19 becomes to be ohmic contacted with the p-type contact layer 17.
(Process 12)

Next, a lower electrode is formed as the lower electrode layer 11 on the rear side of the above manufactured epitaxial wafer for semiconductor laser diodes in the visible light range with the long wavelength, such as in the green light range or the like. Here, it is considered that the ZnO substrate 12 has the function of the n-type conductivity as in the case thereof.

Specifically, the electrode is formed as the n-type lower electrode layer 11, such as for example Ti/Al, Ti/Pt/Au, or the like, by the following steps of: forming the electrode pattern using the lithography technique; depositing the electrode metal using the resistance heating, the EB, or the spattering method; and processing the sintering treatment. In this case, the formed n-type lower electrode layer 11 becomes to be ohmic contacted with the ZnO substrate 12. Additionally, it is preferable to polish the ZnO substrate 12 to be thinner by the CMP treatment before forming the lower electrode layer 11.
(Process 13)

Next, a resonator edge face of the semiconductor laser diode is formed. Here, such the resonator edge face is formed by cleaving, and a cleavage plane is to be the m-plane ((1$\bar{1}$00) plane).
(Process 14)

Next, an AR coating film and an HR coating film are formed on a light emission side edge face and a light reflection side edge face of the resonator edge faces respectively.

Thus, all the processes are end for manufacturing the semiconductor laser diode 100 to emit in the visible light range with the long wavelength, such as in the green light range or the like.

According to the second embodiment including the above mentioned structures, the following functions and advantages are obtained.

It is able to obtain a steep nitride/oxide interface between the ZnO substrate 12 and the active layer 15, and to obtain the excellent crystal of InGaN for the active layer 15, because the Pseudo-morphic layer 130 is formed therebetween. As a result, it becomes able to obtain the semiconductor laser diode as the semiconductor light emitting element with the high luminescent efficiency and the high reliability.

Figure 14:
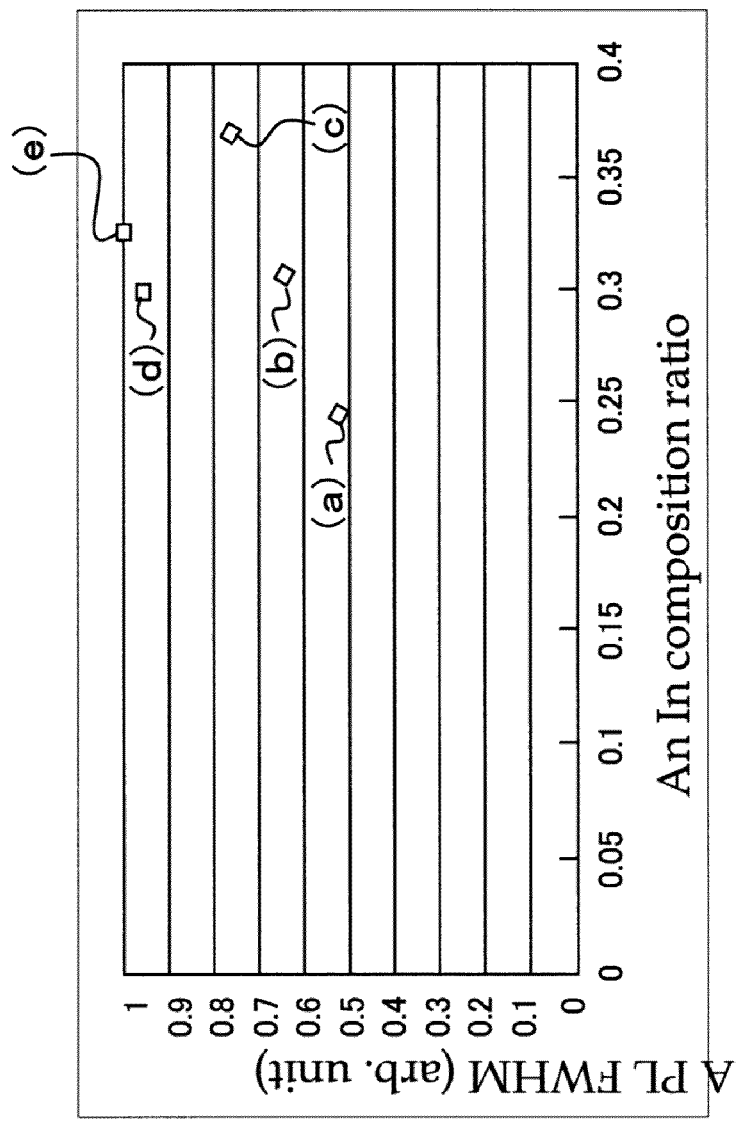
FIG. 14 is a graph showing values of a photoluminescence (PL) with a full width at half maximum (FWHM), in the case of with or without a Pseudo-morphic layer.

There are shown relative values of a photoluminescence (PL) with a full width at half maximum (FWHM), in the case of with or without the Pseudo-morphic layer 130 in FIG. 14. Here, (a) to (e) mean the PL FWHM in the case of the Indium (In) composition of 0.240, 0.310, 0.370, 0.300 and 0.325 respectively. Moreover, (a) to (c) corresponds to the case with the Pseudo-morphic layer 130, meanwhile, (d) and (e) corresponds to the case without the Pseudo-morphic layer 130.

According to FIG. 14, it is able to obtain the semiconductor laser diode with the high luminescent efficiency (strong emission intensity) because of the PL FWHM becoming narrower than that in the case of no Pseudo-morphic layer, by forming the Pseudo-morphic layer 130 between the ZnO substrate 12 and the active layer 15.

It is able to obtain the active layer 15 comprising the excellent crystalline, as it is able to grow the InGaN based active layer 15 lattice-matched with the ZnO substrate 12 onto the top surface of the Pseudo-morphic layer 130 with maintaining the lattice constant of the ZnO substrate 12, because the Pseudo-morphic layer 130 is to be formed of GaN as the thin layer with the thickness of not less than 1 ML, but not more than the critical thickness for the substrate.

It is able to suppress the piezo electric field and the phase separation even with using the InGaN based active layer 15 having the high Indium (In) composition necessary for realizing the semiconductor laser diode to emit in the visible light range with the long wavelength, such as in the green light range or the like, as the semiconductor light emitting element for the green emission. Therefore, it is able to realize the semiconductor laser diode for the green emission as the long wavelength, which is the InGaN based with the uniform in composition distribution and with the high In composition ratio.

It is able to comprise the semiconductor laser diode 100 as a vertical injection structured semiconductor device by forming the lower electrode layer 11 on the rear surface of the ZnO substrate 12, because the ZnO substrate 12 has the function of the n-type conductivity. That is to say, it becomes able to realize the semiconductor laser diode 100 as the vertical semiconductor device (vertical injection type device), because it is able to flow an electric current vertically from the front surface side to the rear surface side in the ZnO substrate 12 thereby.

In the above mentioned InGaN based active layer 15, the Indium (In) composition is set to be for the emission wavelength of not less than 480 nm. Specifically, the active layer 15 is comprised of the InGaN layer with the Indium (In) composition as approximately 30% for the emission wavelength in the green light range. Therefore, it is able to realize the semiconductor laser diode 100 as emission possible in the visible light range with the wavelength longer than the blue light, such as in the green light range for example.

It is able to confine the light stably and efficiently inside the active layer 15 which functions as the core because of being sandwiched between the optical guiding layers 21 and 22, as the optical guiding layer 21 is formed between the lower cladding layer 14 and the active layer 15 and the optical guiding layer 22 is formed between the active layer 15 and the upper cladding layer 16 respectively.

It is able to form the above mentioned epitaxial wafer for semiconductor laser diodes on the c-plane ((000$\bar{1}$) plane) as the O-polar of the ZnO substrate 12 using the RF-MBE method. Moreover, it is able to obtain the wafer surface with excellent flatness for the c-plane ((000$\bar{1}$) plane) as the O-polar (refer to (D) in FIG. 12), by the steps of: processing the surface flattening as the above mentioned (Process 1a), that is to say, processing the CMP treatment for the ZnO substrate 12; and processing the heat treatment in the air atmosphere with being the ZnO substrate 12 sandwiched between flat plates of inorganic construction materials, such as the zinc oxide or the like. In FIG. 12, there is shown a relative surface roughness in root mean square (RMS) after the CMP process or after the heat treatment on the c-plane ((000$\bar{1}$) plane) as the O-polar of the ZnO substrate 12 (refer to (C) and (D)), and on the c-plane ((0001) plane) as the Zn-polar of the ZnO substrate 12 (refer to (A) and (B)), respectively.

That is to say, in FIG. 12, (A) means the relative surface roughness in RMS after the CMP process on the c-plane ((0001) plane) as the Zn-polar of the ZnO substrate 12, (B) means the relative surface roughness in RMS after the heat treatment thereon. Meanwhile, (C) means the relative surface roughness in RMS after the CMP process on the c-plane ((000$\bar{1}$) plane) as the O-polar of the ZnO substrate 12, and (D) means the relative surface roughness in RMS after the heat treatment thereon.

According to FIG. 12, it is obvious that the substrate surface with the excellent flatness is obtained for the c-plane ((000$\bar{1}$) plane) as the O-polar of the ZnO substrate 12 by performing the above mentioned surface flattening process of (Process 1a) in the case of forming the above mentioned epitaxial wafer thereon. Thus, it is able to obtain the further preferred crystal for the InGaN based active layer 15, because of obtaining the steep interface between the ZnO substrate 12 and the active layer 15 by further suppressing the Ga diffusion from the active layer 15 into the ZnO substrate 12, as the ZnO substrate 12 become to have the excellently flat surface. As a result, it becomes able to obtain the semiconductor laser diode 100 with the high luminescent efficiency and the high reliability.

The Third Embodiment

Figure 15:
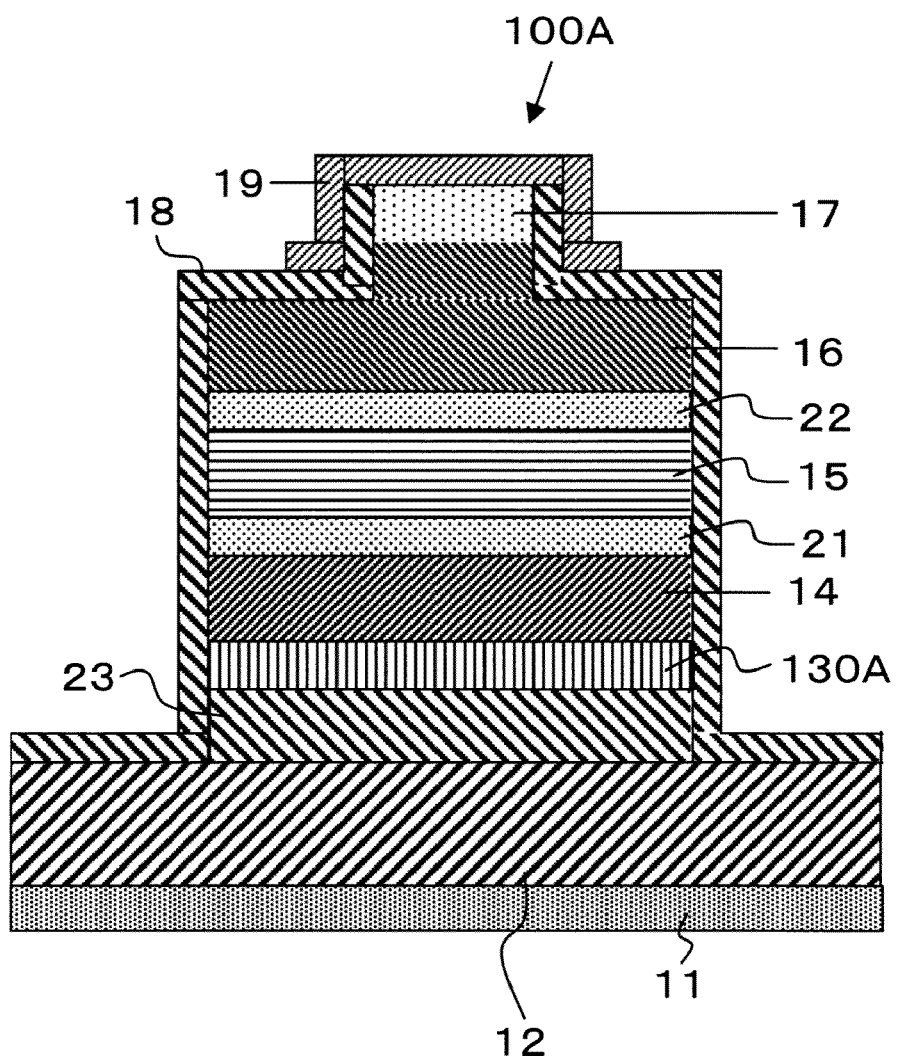
FIG. 15 is a cross sectional view showing a brief configuration of a semiconductor laser diode according to the third embodiment of the present invention.
Figure 16:
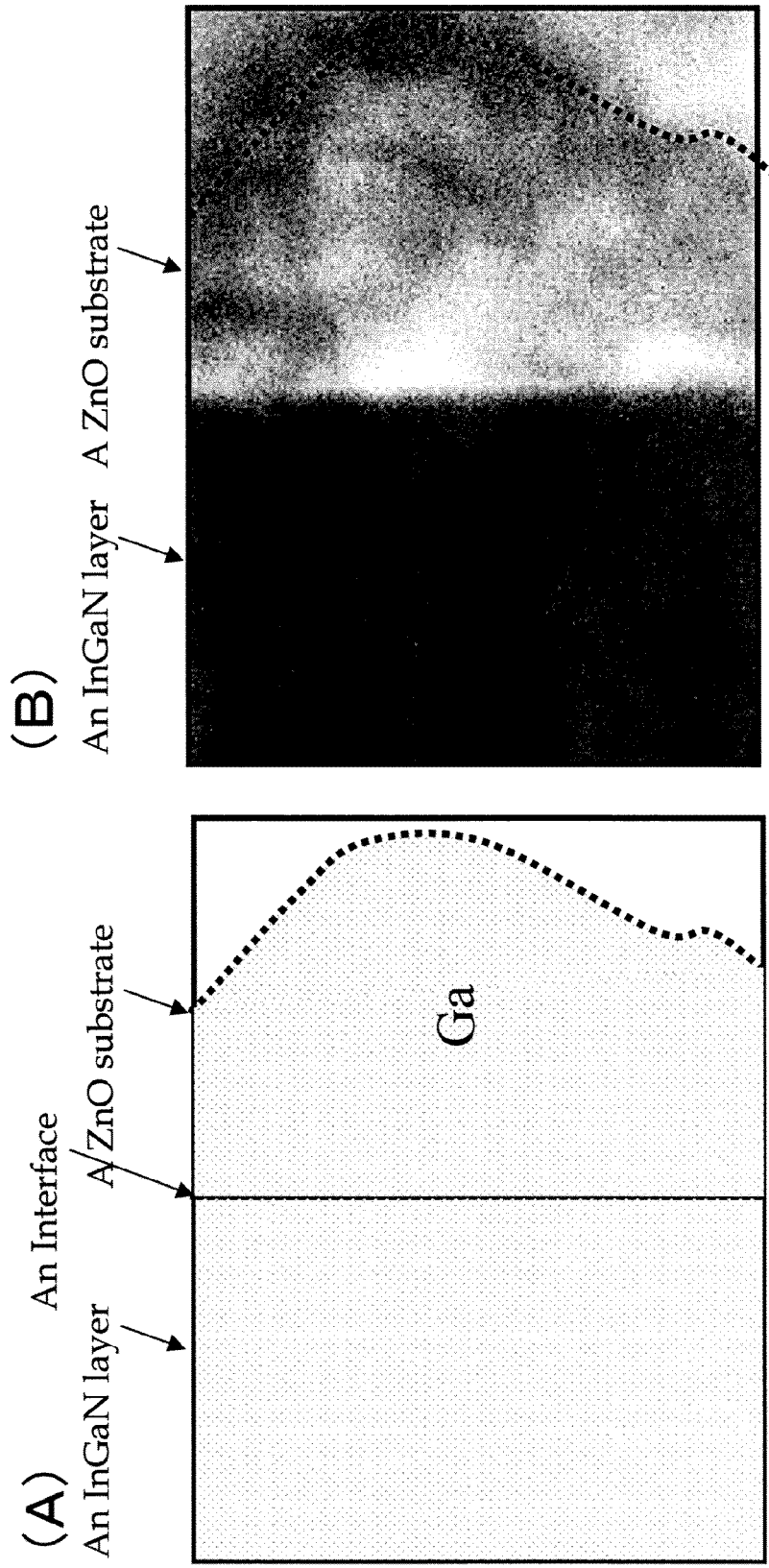
FIG. 16 (A) is a drawing showing an aspect of being diffused a Ga into a ZnO single crystal substrate, and FIG. 16 (B) is a photograph showing the aspect thereof.

Based on FIG. 15, a semiconductor laser diode 100A as a semiconductor light emitting element according to the third embodiment of the present invention will be described in detail below. FIG. 15 is a cross sectional view showing a brief configuration of the semiconductor laser diode 100A according to the third embodiment.

In the above mentioned semiconductor laser diode 100 according to the second embodiment as shown in FIG. 11, the epitaxial wafer for semiconductor laser diodes to emit in the visible light range with the long wavelength, such as in the green light range or the like, is formed on the c-plane ((000$\bar{1}$) plane) as the oxygen polar (O-polar) of the ZnO substrate 12 following the above mentioned (Process 1) through (Process 8), with using the RF-MBE method.

On the contrary, in the semiconductor laser diode 100A according to the third embodiment, an epitaxial wafer for semiconductor laser diodes to emit in the visible light range with the long wavelength, such as in the green light range or the like, is formed on an m-plane ((1$\bar{1}$00) plane) as a nonpolar face of the ZnO single crystal substrate 12, with using the RF-MBE method.

Moreover, there are provided a Lattice-matched layer 23 of ZnO formed on the ZnO substrate 12 and a Pseudo-morphic layer 130A of superlattice formed on the Lattice-matched layer 23 in the epitaxial wafer for the semiconductor laser diode 100A. The Pseudo-morphic layer 130A is formed by growing a GaN crystal with a thickness of 4 ML onto the Lattice-matched layer 23. Other parts in the configuration of the epitaxial wafer for the semiconductor laser diode 100A is similar to that of the second embodiment.

Next, a method of manufacturing the semiconductor laser diode 100A will be described in detail below, mainly regarding the difference from the above described method of manufacturing the semiconductor laser diode 100 according to the second embodiment.

Here, in the present embodiment, the above mentioned epitaxial wafer for semiconductor laser diodes to emit in the visible light range with the long wavelength, such as in the green light range or the like, is formed on the m-plane ((1$\bar{1}$00) plane) as the nonpolar face of the ZnO single crystal substrate 12, with using the RF-MBE method.

First, the Lattice-matched layer (ZnO lattice matched layer) 23 is formed on the m-plane ((1$\bar{1}$00) plane) of the ZnO substrate 12 in the following (Process 3-1), after performing the above mentioned (Process 1): including (Process 1a) through (Process 1c).

(Process 3-1)

It is able to grow a high quality ZnO lattice matched layer 23 by the following steps of: growing the ZnO lattice matched layer 23 as approximately 100 nm thickness at the growth temperature of lower than 750° C.; performing a heat treatment at approximately 1000° C.; and depositing a main layer of the ZnO lattice matched layer 23 as approximately 1 μm at the deposition temperature of 800° C. approximately. Moreover, the ZnO lattice matched layer 23 may have the function of the n-type conductivity by doping at least any one of Al, Ga and In into the ZnO lattice matched layer 23 at the period of growing thereof.

Next, the following (Process 3-2) is performed instead of the above mentioned (Process 2).

(Process 3-2)

A quasi lattice matched layer is formed as the Pseudo-morphic layer 130A by growing the GaN crystal layer with a thickness of 4 ML on the ZnO lattice matched layer 23, by supplying the Ga together with the nitrogen (N) radicals at the growth temperature of lower than 750° C., for example at a low temperature of 500° C. approximately.

Moreover, the Pseudo-morphic layer 130A may have the function of the n-type conductivity by Si doping at the period of growing thereof. For suppressing the interface reaction between the ZnO substrate 12 and the Pseudo-morphic layer 130A of GaN, it is required to perform the growth of the GaN crystal at such the low temperature.

(Process 3-3)

Next, a cladding layer is formed as the lattice-matched based lower cladding layer 14 by growing the AlGaInN crystal layer, by supplying the N radicals together with the materials of In, Ga and Al from the corresponding cells with optimally set temperatures respectively, with setting the growth temperature as lower than 750° C., at approximately 450° C. for example. In such the case, the composition of the AlGaInN crystal layer is designed to be lattice-matched with the ZnO substrate 12, however, theoretically it is impossible to be lattice-matched with both of the a-axis and the c-axis due to the growth on the m-plane of the ZnO substrate 12. Therefore, the lattice constant of the AlGaInN lower cladding layer 14 is to be matched here by the following three conditions for adjusting the lattice constant as called a lattice matching in the case of growing the nitride based semiconductor on the m-plane of the ZnO substrate:

(a) adjusting the composition for lattice matching toward the a-axis direction;

(b) adjusting the composition for lattice matching toward the c-axis direction; and (c) adjusting the composition for between the lattice-matched composition for the a-axis and that for the c-axis.

(Process 3-4)

Next, a layer is formed for optical guiding as the optical guiding layer 21 by growing the InGaN crystal layer on the lattice-matched based lower cladding layer 14, by supplying the materials of In together with the Ga and the N radicals at the growth temperature of lower than 750° C., at the similar 450° C. for example. In such the case, the Indium (In) composition of the InGaN crystal layer is designed as between that of the lower cladding layer 14 and that of an InGaN based active layer 15.

(Process 3-5)

Next, an active layer is formed of InGaN as the InGaN based active layer 15 with the Indium (In) composition of approximately 30% for emitting in the green light wavelength range, by supplying the N radicals together with the materials of In and Ga, after resetting each cell temperature for the optimum In/Ga ratio and the ratio between the group V and the group III (V-III ratio), or after replacing with preset cells for the In and the Ga if comprising a plurality of cells, with the growth temperature of lower than 750° C., at the similar 450° C. for example.

(Process 3-6)

Next, a layer is formed for optical guiding as the optical guiding layer 22 by growing the InGaN crystal layer on the active layer 15, by supplying the materials of In together with the Ga and the N radicals, with the growth temperature of lower than 750° C., at the similar 450° C. for example. In such the case, the Indium (In) composition of the InGaN is designed as between that of a lattice-matched based upper cladding layer 16 and that of the InGaN based active layer 15.

(Process 3-7)

Next, a cladding layer is formed as the lattice-matched based upper cladding layer 16 by growing the AlGaInN crystal layer, by supplying the N radicals together with the materials of In, Ga and Al from the corresponding cells with optimally set temperatures respectively, with setting the growth temperature of lower than 750° C., at approximately 450° C. for example. In such the case, the composition of the AlGaInN crystal layer is designed to be lattice-matched with the ZnO substrate 12, however, theoretically it is impossible to be lattice-matched with both of the a-axis and the c-axis due to the growth on the m-plane of the ZnO substrate 12. Therefore, the lattice constant of the AlGaInN upper cladding layer 16 is to be matched here by the following three conditions for adjusting the lattice constant as called the lattice matching in the case of growing the nitride based semiconductor on the m-plane of the ZnO substrate:

(a) adjusting the composition for lattice matching toward the a-axis direction;

(b) adjusting the composition for lattice matching toward the c-axis direction; and (c) adjusting the composition for between the lattice-matched composition for the a-axis and that for the c-axis.

All the other processes for manufacturing the above mentioned epitaxial wafer is similar to that of the above described second embodiment.

According to the above described processes, it becomes possible to manufacture the epitaxial wafer for the semiconductor laser diode 100A to emit in the visible light range with the long wavelength, such as in the green light range.

Additionally, it may also able to perform further processes for forming other layers at the high temperature of not less than 750° C., after depositing the nitride onto the ZnO single crystal substrate 12.

Furthermore, it is desirable to use the individual growth equipments for depositing the nitride of AlGaInN and the oxide of ZnMgBeCdO respectively. In such the case, the epitaxial wafer is not exposed to the air at the all periods of the deposition processes for every layer because each equipment is jointed using the vacuum loader/unloader.

Thus, all the processes are end for manufacturing the semiconductor laser diode 100A to emit in the visible light range with the long wavelength, such as in the green light range or the like, with using the above manufactured epitaxial wafer to manufacture the laser diode structure following the above described (Process 9) through (Process 14) in the second embodiment.

According to the third embodiment including the above mentioned structure, the following functions and advantages are obtained, adding to the functions and advantages obtained by the above described second embodiment.

It is able to obtain the active layer 15 comprising further excellent crystalline of InGaN which is grown as lattice-matched with the ZnO substrate 12, because it is able to obtain the excellently flat top surface of the ZnO lattice matched layer 23 formed on the ZnO substrate 12 before growing the active layer 15 thereon. As a result, it becomes able to obtain the semiconductor laser diode with being the luminescent efficiency and the reliability further improved.

Moreover, the present invention is also able to be embodied with modifying as follows.

The present invention is applicable to a semiconductor light emitting element, such as a semiconductor laser diode or the like, which has a configuration except the optical guiding layer 21 and 22. That is to say, the present invention is widely applicable to a semiconductor laser diode as a semiconductor light emitting element comprising: a ZnO single crystal substrate; and a Pseudo-morphic layer, a lower cladding layer, an active layer, a upper cladding layer and a contact layer formed in order on the ZnO single crystal substrate.

Moreover, the present invention is widely applicable to a method of manufacturing a semiconductor light emitting element, such as a semiconductor laser diode or the like, comprising the steps of: processing of substrate surface treatments for surface reforming a ZnO single crystal used as a substrate; processing of a Pseudo-morphic layer formation to form a Pseudo-morphic layer on the substrate; processing of a lower cladding layer formation to form a lower cladding layer lattice-matched with the ZnO single crystal substrate and/or an active layer; processing of an active layer formation to form an active layer of indium gallium nitride ($In_xGa_{1-x}N$, $0<x<1$) on the lower cladding layer; processing of a upper cladding layer formation to form a upper cladding layer on the active layer, lattice-matched with the ZnO single crystal substrate and/or the active layer; and processing of a contact layer formation to form a contact layer on the upper cladding layer.

Furthermore, the present invention is also applicable to a semiconductor laser diode as a semiconductor light emitting element having the function of the p-type conductivity for the ZnO substrate 12, the Pseudo-morphic layer 130 or 130A, the lower cladding layer 14, the optical guiding layer 21 and the lower electrode layer 11, and having the function of the n-type conductivity for the optical guiding layer 22, the upper cladding layer 16 and the contact layer 17, as the reversed conductivity for each layer in the above described each embodiment respectively.

In the above described second embodiment, the above mentioned epitaxial wafer for semiconductor laser diodes is formed on the c-plane (($000\bar{1}$) plane) as the O-polar of the ZnO substrate 12 using the RF-MBE method, however, the present invention is applicable to a semiconductor light emitting element, such as a semiconductor laser diode or the like, with using such the epitaxial wafer formed on the c-plane ((0001) plane) as the Zn-polar of the ZnO substrate 12. In such the case, it is able to obtain an excellently flat surface for the c-plane ((0001) plane) as the Zn-polar of the ZnO substrate 12 by performing the second CMP process after the heat treatment in the surface flattening process of the above described (Process 1a), even though the flatness is slightly rougher than that of the c-plane (($000\bar{1}$) plane) as the O-polar of the ZnO substrate 12 before the second CMP process shown as (B) in FIG. 12. Thus, it is able to obtain a steep interface between the ZnO substrate 12 and the active layer 15, and to obtain a further excellent crystal of InGaN for the active layer 15, because it is able to suppress the diffusion of Ga from the active layer 15 into the ZnO substrate 12. As a result, it becomes able to obtain the semiconductor light emitting element, such as the semiconductor laser diode or the like, with the high luminescent efficiency and the high reliability.

In the above described second embodiment, the Pseudo-morphic layer 130 may also comprise a configuration that a layer with an Indium (In) composition is gradually increased (an InGaN gradient composition layer) on a GaN layer of binary material to be grown for the initial period of growth on the ZnO substrate 12. In the case of such the configuration, it is able to obtain a steep interface between the ZnO substrate 12 and the InGaN active layer 15 as the nitride based semiconductor, by growing the binary material of GaN at the initial period of growing the Pseudo-morphic layer 130.

In the above described third embodiment, it may available to grow an InN crystal layer with a thickness of 4 ML instead of growing the GaN crystal layer of 4 ML thickness for forming the Pseudo-morphic layer 130A. Or, it may also available to grow a superlattice layer of the GaN crystal layer and the InN crystal layer as a multilayer structure with a total thickness of not less than 1 ML, but not more than the critical thickness for the ZnO substrate 12. For example, the GaN crystal layer of 4 ML and the InN crystal layer of 1 ML may be alternately grown, or the GaN crystal layer of 1 ML and the InN crystal layer of 4 ML may be alternately grown, for forming such the Pseudo-morphic layer 130A. Here, the critical thickness of the Pseudo-morphic layer 130A for the ZnO substrate 12 is defined as the critical thickness of an InGaN layer corresponding to an average composition of such the GaN crystal layer and such the InN crystal layer for the above mentioned each example respectively, in the case of the Pseudo-morphic layer 130A to be comprised of such the superlattice layer.

Thus, it is able to obtain the active layer 15 comprising the excellent crystalline, as it is able to grow the active layer 15 of InGaN lattice-matched with the ZnO substrate 12, onto the top surface of the Pseudo-morphic layer 130A with maintaining the lattice constant of the ZnO substrate 12, because the Pseudo-morphic layer 130A is to be formed of GaN and/or InN as the thin layer with the thickness of not less than 1 ML, but not more than the critical thickness for the substrate, in every case of such the configuration. As a result, it becomes able to obtain the semiconductor light emitting element, such as the semiconductor laser diode or the like, with the high luminescent efficiency and the high reliability.

In the above described second embodiment, the epitaxial wafer is formed on the c-plane (($000\bar{1}$) plane) as the O-polar of the ZnO substrate 12, however, it may be also available to use a plane slightly inclined from the c-plane (($000\bar{1}$) plane) as an off-angle of not more than one degree toward the a-axis or as the off-angle of not more than one degree toward the m-axis, for the plane orientation of the ZnO substrate surface.

In the above described third embodiment, it may also available to use a plane orientation as equivalent to the m-plane (($1\bar{1}00$) plane) for that of the ZnO substrate 12.

In the above described every embodiment, it may also available to use a plane orientation of an a-plane (($11\bar{2}0$) plane) or equivalent to the a-plane, an r-plane (($11\bar{2}2$) plane) or equivalent to the r-plane, a (($10\bar{1}1$)) plane or equivalent to the ($10\bar{1}1$) plane, for that of the ZnO substrate 12.

The present invention is applicable to a semiconductor light emitting element, such as a light emitting diode (LED) comprising a p-n junction, or the like, in addition to the case of the semiconductor light emitting element comprised as the semiconductor laser diode in the above described every embodiment.

The present invention is applicable to a semiconductor light emitting element, wherein the active layer 15 is comprised of another nitride based compound semiconductor of group III-V, such as an AlGaInN or the like, in addition to the case of being the active layer 15 comprised of the InGaN in the above described every embodiment.

The present invention is applicable to a configuration that the active layer 15 has a quantum well structure, in addition to the every case of the above described embodiments.

In the case of being the active layer 15 comprised of the AlGaInN crystal layer instead of the InGaN crystal layer for the above described every embodiment, it is also able to suppress the phase separation even with a high Indium (In)

composition for such the active layer 15, because the lattice constant of the ZnO substrate 12 is close to that of the AlGaInN crystal layer as well as that of the InGaN crystal layer as lattice-matched therebetween. Thus, it is able to realize a semiconductor light emitting element to emit in the visible light range between the blue light and the red light, such as in the green light range for example as the longer wavelength than the blue light range in particular, because of obtaining such the AlGaInN based active layer comprising every element with a uniform in composition distribution even with the high Indium (In) composition.

The present invention is not limited to the above described embodiments and various; further modifications may be possible without departing from the scope of the present invention.

This application is based on the Japanese Patent Application Publication No. 2000-077712 filed on Aug. 31, 1998, entire content of which is expressly incorporated by reference herein.

What is claimed is:

1. A semiconductor light emitting element comprising:
   a zinc oxide (ZnO) single crystal substrate with a substrate surface of a plane orientation insusceptible to a piezo electric field;
   a Lattice-matched layer disposed on the substrate surface and lattice-matched with the ZnO single crystal substrate, the Lattice-matched layer comprising a zinc magnesium beryllium cadmium oxide ($Zn_{1-a-b-c}Mg_aBe_b$-$Cd_cO$, $0 \leq a<1$, $0 \leq b<1$, $0 \leq c<1$, $a+b+c \leq 1$);
   an active layer of indium gallium nitride ($In_xGa_{1-x}N$, $0<x<1$);
   an upper cladding layer and a lower cladding layer in contact with the active layer and lattice-matched at least with the active layer and the Lattice-matched layer; and
   a contact layer formed on the upper cladding layer.

2. The semiconductor light emitting element according to claim 1,
   wherein the plane orientation is to be any one of an m-plane (($1\bar{1}00$) plane), an a-plane (($11\bar{2}0$) plane), a c-plane ((0001) plane), an r-plane (($11\bar{2}2$) plane) and a ($10\bar{1}\bar{1}$) plane, or a plane orientation equivalent thereto.

3. The semiconductor light emitting element according to claim 2,
   wherein the upper cladding layer and the lower cladding layer comprise an aluminum gallium indium nitride ($Al_{1-y-z}Ga_yIn_zN$, $0 \leq y<1$, $0 \leq z<1$, $y+z<1$) and/or a zinc magnesium beryllium cadmium oxide ($Zn_{1-a-b-c}Mg_a$-$Be_b Cd_cO$, $0 \leq a<1$, $0 \leq b<1$, $0 \leq c<1$, $a+b+c \leq 1$).

4. The semiconductor light emitting element according to claim 3,
   wherein the lower cladding layer has a function combined with the Lattice-matched layer.

5. The semiconductor light emitting element according to claim 4 further comprising:
   a Pseudo-morphic layer disposed between the ZnO single crystal substrate and the active layer.

6. The semiconductor light emitting element according to claim 5,
   wherein the Pseudo-morphic layer comprises gallium nitride (GaN) with a thickness of not less than one monolayer (ML), but not more than a critical thickness for the ZnO single crystal substrate.

7. The semiconductor light emitting element according to claim 6,
   wherein the Pseudo-morphic layer includes GaN and indium nitride (InN) as a superlattice layer with a thickness of not less than one ML, but not more than a critical thickness for the ZnO single crystal substrate.

8. The semiconductor light emitting element according to claim 7,
   wherein an Indium (In) composition in the active layer is $\geq 20\%$ and $\leq 100\%$.

9. A method of manufacturing a semiconductor light emitting element, comprising the steps of:
   processing of substrate surface treatments for reforming a substrate surface of a zinc oxide (ZnO) single crystal as a substrate with a plane orientation insusceptible to a piezo electric field;
   processing of a Lattice-matched layer formation to form a Lattice-matched layer on the substrate surface, as lattice-matched with the ZnO single crystal substrate, the Lattice-matched layer comprising a zinc magnesium beryllium cadmium oxide ($Zn_{1-a-b-c}Mg_aBe_bCd_cO$, $0 \leq a<1$, $0 \leq b<1$, $0 \leq c<1$, $a+b+c \leq 1$);
   processing of a lower cladding layer formation to form a lower cladding layer on the Lattice-matched layer, as lattice-matched with an active layer and/or the Lattice-matched layer;
   processing of an active layer formation to form the active layer of indium gallium nitride ($In_xGa_{1-x}N$, $0<x<1$) on the lower cladding layer; and
   processing of an upper cladding layer formation to form an upper cladding layer on the active layer, as lattice-matched with the active layer and/or the Lattice-matched layer.

10. The method of manufacturing a semiconductor light emitting element according to claim 9,
    wherein the plane orientation is to be any one of an m-plane (($1\bar{1}00$) plane), an a-plane (($11\bar{2}0$) plane), a c-plane ((0001) plane), an r-plane (($11\bar{2}2$) plane) and a ($10\bar{1}\bar{1}$) plane, or a plane orientation equivalent thereto.

11. The method of manufacturing a semiconductor light emitting element according to claim 10, further comprising the steps of:
    processing of a Pseudo-morphic layer formation to form a Pseudo-morphic layer between the ZnO single crystal substrate and the active layer.

12. The method of manufacturing a semiconductor light emitting element according to claim 11,
    wherein the processing of the Pseudo-morphic layer formation processes a heat treatment before forming the Pseudo-morphic layer, in a vacuum, in an oxygen atmosphere, or with exposing to an oxygen plasma.

13. The method of manufacturing a semiconductor light emitting element according to claim 12,
    wherein the processing of the Pseudo-morphic layer formation further processes for the Pseudo-morphic layer to glow in a temperature environment of lower than 750° C., with using a nitrogen plasma.

14. The semiconductor light emitting element according to claim 1, wherein the ZnO single crystal substrate is a p-type conductive type, and the upper cladding layer is an n-type conductive type.

15. The semiconductor light emitting element according to claim 1, wherein the ZnO single crystal substrate is an n-type conductive type, and the upper cladding layer is a p-type conductive type.

16. The method of manufacturing a semiconductor light emitting element according to claim 9, wherein the ZnO single crystal substrate is a p-type conductive type, and the upper cladding layer is an n-type conductive type.

17. The method of manufacturing a semiconductor light emitting element according to claim 9, wherein the ZnO single crystal substrate is an n-type conductive type, and the upper cladding layer is a p-type conductive type.

* * * * *